US012610784B2

(12) United States Patent
Lu et al.

(10) Patent No.: US 12,610,784 B2
(45) Date of Patent: Apr. 21, 2026

(54) SYSTEMS, DEVICES, AND METHODS FOR REGISTERING A SUPERSTRATE OF AN IMPRINT TOOL

(71) Applicant: CANON KABUSHIKI KAISHA, Tokyo (JP)

(72) Inventors: Xiaoming Lu, Cedar Park, TX (US); Jeffrey Dean Klein, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 520 days.

(21) Appl. No.: 18/059,291

(22) Filed: Nov. 28, 2022

(65) Prior Publication Data

US 2024/0178042 A1      May 30, 2024

(51) Int. Cl.
| | |
|---|---|
| *H01L 21/683* | (2006.01) |
| *G01N 21/95* | (2006.01) |
| *G03F 7/00* | (2006.01) |
| *H01L 21/68* | (2006.01) |

(52) U.S. Cl.
CPC ..... *H01L 21/6838* (2013.01); *G01N 21/9503* (2013.01); *G03F 7/707* (2013.01); *H01L 21/681* (2013.01)

(58) Field of Classification Search
CPC .............. H01L 21/6838; H01L 21/681; G01N 21/9503; G03F 7/707
See application file for complete search history.

(56) References Cited

U.S. PATENT DOCUMENTS

| | | | |
|---|---|---|---|
| 8,023,110 B1 | 9/2011 | Ngai | |
| 8,580,078 B2 * | 11/2013 | Bailey, III | ........ H01L 21/02087 |
| | | | 156/345.43 |
| 11,946,142 B2 * | 4/2024 | Shaikh | .............. H01L 21/67109 |
| 2007/0188859 A1 | 8/2007 | Tokita | |
| 2009/0122304 A1 | 5/2009 | Jin | |
| 2010/0134779 A1 | 6/2010 | Yasuda | |
| 2022/0115259 A1 | 4/2022 | Bamesberger | |

* cited by examiner

*Primary Examiner* — Hung V Nguyen
(74) *Attorney, Agent, or Firm* — Canon U.S.A., Inc. IP Division

(57) ABSTRACT

Some devices, systems, and methods hold a periphery of a back surface of a plate with a flexible ring portion of a chuck assembly; apply a negative vacuum pressure to a central portion of the back surface of the plate to bow the central portion of the plate such that the back surface of the plate forms a convex surface and a front surface of the plate forms a concave surface; measure, at or near the periphery of the plate, distances between the plate and a reference location; and identify a location of a transition point of a tapered edge of the plate based on the measured distances.

17 Claims, 14 Drawing Sheets

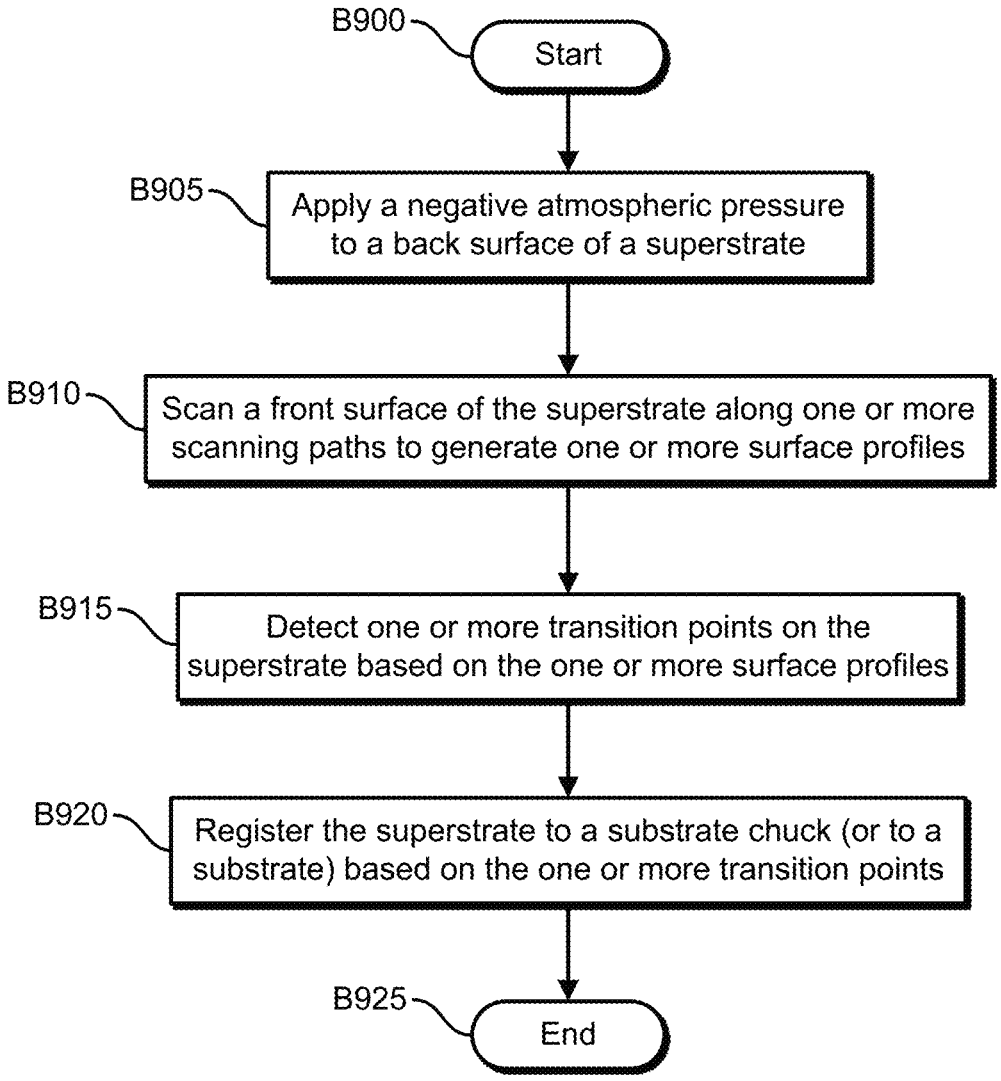

B900 — Start

B905 — Apply a negative atmospheric pressure to a back surface of a superstrate

B910 — Scan a front surface of the superstrate along one or more scanning paths to generate one or more surface profiles B915 — Detect one or more transition points on the superstrate based on the one or more surface profiles B920 — Register the superstrate to a substrate chuck (or to a substrate) based on the one or more transition points B925 — End

FIG. 9

SYSTEMS, DEVICES, AND METHODS FOR REGISTERING A SUPERSTRATE OF AN IMPRINT TOOL

BACKGROUND

Technical Field: This application generally concerns an imprint system and a method that aligns a superstrate to a substrate.

Background: Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, optical components, and the like.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) involves dispensing a variable drop pattern of polymerizable material between the substrate and a superstrate, where the drop pattern varies depending on the substrate's relief pattern. A superstrate is then brought into contact with the polymerizable material, after which the material is polymerized on the substrate, and the superstrate removed.

Various lithographic patterning techniques benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL), planarization improves feature filling and CD control after pattern transfer.

Also, some nanoimprint lithography techniques form a feature pattern in a formable material (polymerizable) layer and transfer a pattern corresponding to the feature pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

And a substrate with polymerized material can be further subjected to known procedures and processes for device (article) fabrication, including, for example, curing, oxidation, layer formation, deposition, doping, planarization, etching, formable material removal, dicing, bonding, packaging, and the like.

When forming nanoscale patterns on semiconductor wafers in the fabrication of semiconductor devices, proper registration of a superstrate to a substrate is important for the final semiconductor device to function correctly.

SUMMARY

Some embodiments of a method of measuring a tapered edge on a plate comprise holding a periphery of a back surface of a plate with a flexible ring portion of a chuck assembly; applying a negative vacuum pressure to a central portion of the back surface of the plate to bow the central portion of the plate such that the back surface of the plate forms a convex surface and a front surface of the plate forms a concave surface; measuring, at or near the periphery of the plate, distances between the plate and a reference location; and identifying a location of a transition point of a tapered edge of the plate based on the measured distances.

Some embodiments of an imprint system comprise a sensor; a vacuum pump; a superstrate chuck including a flexible ring portion, wherein the flexible ring portion is configured to hold a periphery of a back surface of a plate; one or more memories; and one or more processors. Also, the one or more processors and the one or more memories cooperate to cause the imprint system to perform operations that comprise controlling the vacuum pump to generate an atmospheric pressure at a central portion of the back surface of the plate that is lower than an atmospheric pressure at the central portion of a front surface of the plate such that the back surface of the plate forms a convex surface and the front surface of the plate forms a concave surface; controlling the sensor to measure, at each measuring point of a plurality of measuring points at or near the periphery of the front surface the plate, a distance between the measuring point and a reference location; and identifying a respective location of each transition point of one or more transition points of a tapered edge of the plate based on the respective distance at each measuring point of the plurality of measuring points.

Some embodiments a method comprise holding a periphery of a back surface of a plate with a flexible ring portion of a chuck, wherein the plate includes a front surface, wherein the front surface includes a contact surface that is surrounded by a sloping edge, and wherein, between the contact surface and an edge of the plate, the sloping edge slopes away from the contact surface toward the back surface; reducing an atmospheric pressure at a central portion of the back surface of the plate such that the back surface of the plate forms a convex surface and the front surface of the plate forms a concave surface; measuring, for each point of a plurality of points on the front surface of the plate that are at or near a periphery of the front surface of the plate, a respective distance between the point and a plane of the chuck; and identifying at least one transition point between the sloping edge and the contact surface based on the respective distances.

BRIEF DESCRIPTION OF THE DRAWINGS

FIG. 9 illustrates an example embodiment of an operational flow for registering a superstrate to a substrate chuck (or to a substrate).

DESCRIPTION

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or." And, as used herein, the terms "first," "second," and so on, do not necessarily denote any ordinal, sequential, or priority relation and may be used to more clearly distinguish one member, operation, element, group, collection, set, etc. from another without expressing any ordinal, sequential, or priority relation.

Figure 1:
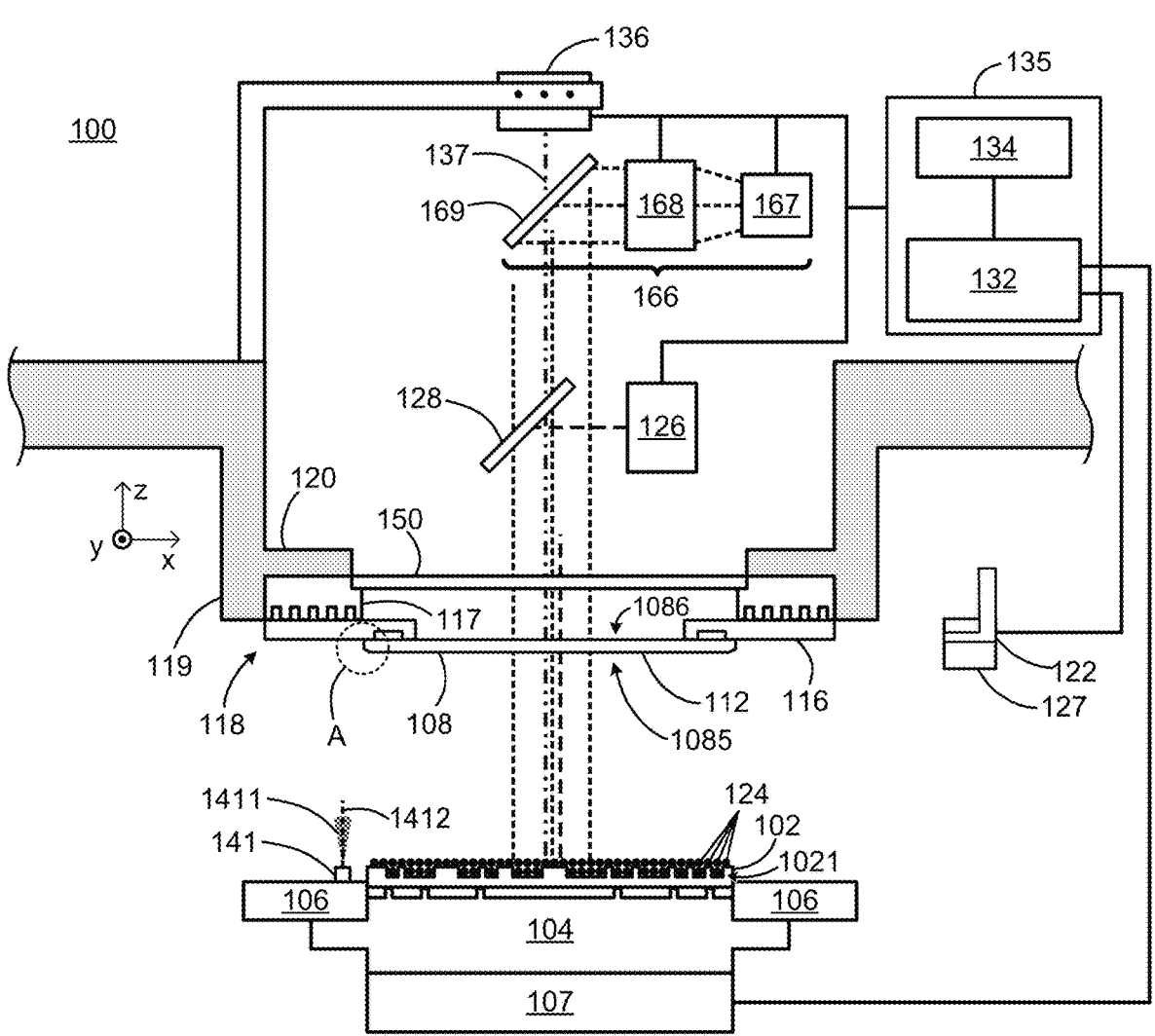
FIG. 1 illustrates an example embodiment of an imprint system.

FIG. 1 illustrates an example embodiment of an imprint system 100 (e.g., a nanoimprint lithography system). Also, in some embodiments, the imprint system 100 is implemented as a single imprint device. When operating, the imprint system 100 deposits drops of formable material 124 (e.g., resist) on a substrate 102 and uses a plate (e.g., a superstrate 108) to, for example, planarize the formable material 124.

The substrate 102 may include a topography 1021 on a surface that is proximal to the superstrate 108. In FIG. 1, the topography 1021 is a feature pattern (e.g., a relief pattern). The topography 1021 may be composed of doped regions, etched regions, or other modifications. And the topography 1021 may also be composed of cured formable material (e.g., resist, planarization material), films of insulating material, or metal. For example, the topography 1021 may be composed of etchings in one or more underlying layers. And in some embodiments, the substrate 102 is in the form of a wafer.

In the embodiment of the imprint system 100 in FIG. 1, the perimeter of the substrate 102 is surrounded by an applique 106. The applique 106 may be configured to stabilize the local gas environment beneath the superstrate 108 or to help protect the substrate 102 and the formable material 124 from particles, for example when the superstrate 108 is separated from the formable material 124 and the substrate 102. Furthermore, a back surface of the applique 106 may be below (as shown in FIG. 1) or coplanar with the substrate surface.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational and/or rotational motion along one or more of the x-, y-, and z-axes, and the rotational motion may be defined by the $\theta$, $\psi$, and $\phi$ angles. The substrate positioning stage 107, the substrate 102, and the substrate chuck 104 may also be positioned on a base (not shown). Additionally, the substrate positioning stage 107 may be a part of a positioning system or a positioning subsystem.

The imprint system 100 also includes at least one sensor 141, which is mounted on the applique 106 in this embodiment (although the sensor 141 may be mounted on the substrate chuck 104 in some embodiments). For example, the sensor 141 may be a spectral-interference displacement sensor (e.g., a spectral-interference laser displacement meter, such as a micro-head spectral-interference laser displacement meter), a capacitance sensor, an air-gauge sensor, an optical-phase sensor, a polarization sensor, or the like. Also, the sensor 141 may include a light emitter that emits light, as well as a corresponding light sensor that measures an intensity of the light. The sensor 141 generates signals that can be used to detect contaminants (e.g., particles) on the front surface 1085 of the superstrate 108, for example by moving the sensor 141 relative to the superstrate 108 such that the sensor 141 scans the surface of the superstrate 108. Furthermore, the sensor 141 can generate signals that can be used to measure the relative movement of a reflective (or partially reflective) face of the superstrate 108 relative to another component, such as the substrate chuck 104. Also, the sensor 141 can generate signals that can be used to detect an edge of the superstrate 108 or to detect a transition boundary on the superstrate 108 (e.g., the transition boundary 1081 in FIG. 2A). For ease of illustration, the sensor 141 is illustrated as being above the applique 106. But, in some embodiments, a sensing surface of the sensor 141 is coplanar with a gas-controlling surface of the applique 106, below a gas-controlling surface of the applique 106, or below or coplanar with a chucking surface of the substrate chuck 104.

Although FIG. 1 illustrates only one sensor 141, some embodiments include multiple sensors 141. When multiple sensors 141 are included, the sensors 141 may be evenly spaced around the applique 106 or the substrate chuck 104, or the sensors 141 may be arranged in another configuration.

In some embodiments, the superstrate 108 is readily transparent to ultraviolet (UV) light. And examples of materials that may constitute the superstrate 108 include the following: fused-silica, quartz, silicon, organic polymers, siloxane polymers, borosilicate glass, fluorocarbon polymers, metal, and hardened sapphire.

The superstrate 108 has a front surface 1085 that faces the substrate 102, and the front surface 1085 includes a contact surface 112. The superstrate 108 also has a back surface 1086 that faces away from the substrate 102. The contact surface 112 may generally be of the same area or size as, or slightly smaller than, the front surface 1085 of the superstrate 108. The contact surface 112 of the superstrate 108 may be or may include a planar contact surface. In some embodiments (e.g., embodiments that perform Inkjet-based Adaptive Planarization (IAP)), including the embodiment in FIG. 1, the contact surface 112 of the plate (the superstrate 108 in this example embodiment) is featureless. And, in some embodiments, the contact surface 112 of the plate includes features that define a pattern that forms the basis of (e.g., an inverse of) a pattern to be formed on the substrate 102. In some embodiments, the contact surface 112 is on a mesa of the plate (the superstrate 108 in this example embodiment). In some embodiments, an area of the contact surface 112 is smaller than an area of the substrate 102, and a step-and-repeat process is used to shape a surface of formable material 124 on the substrate 102.

Figure 2A:
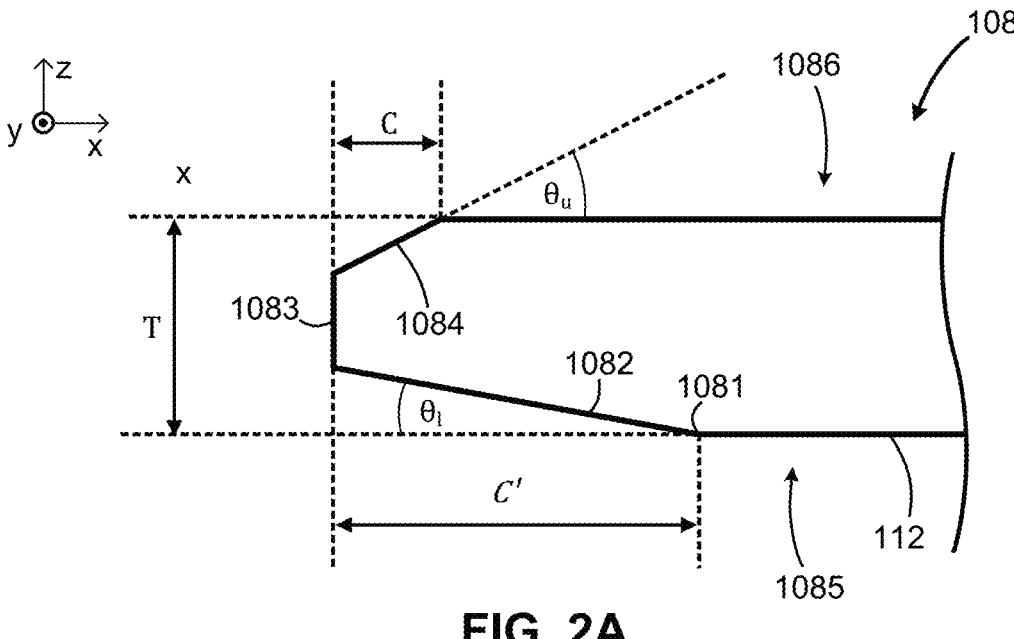
FIGS. 2A and 2B illustrate an example embodiment of a tapered region of a superstrate.
Figure 2B:
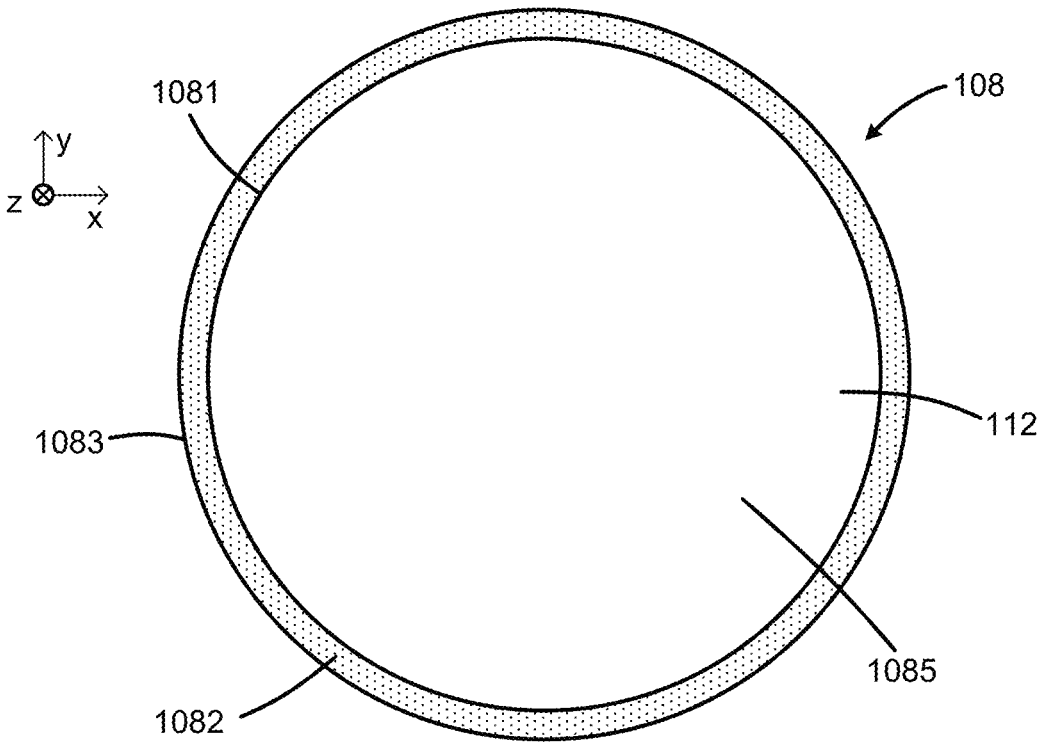

The superstrate 108 may have a tapered edge. For example, the periphery of the front surface 1085 of the superstrate 108 may include a tapered region 1082. For example, FIGS. 2A and 2B illustrate an example embodiment of a tapered region 1082 of a superstrate 108 that has a tapered edge. FIG. 2A shows a cross-sectional view of the superstrate 108 in area A in FIG. 1 in more detail. FIG. 2B show a view of the front surface 1085 of the superstrate 108 from along the z axis, which is perpendicular to the view in FIG. 1 and FIG. 2A. The front surface 1085 of the superstrate 108 includes a tapered region 1082, and the tapered region 1082 surrounds the contact surface 112 and forms a border between the edge 1083 and the contact surface 112. In a radial direction from the center of the superstrate 108 toward the edge 1083 of the superstrate 108, the tapered region 1082 slopes away (upward in FIG. 2A) from the contact surface 112 at angle θ1. Furthermore, a transition boundary 1081 is located at the border between the contact surface 112 and the tapered region 1082. Thus, the transition boundary 1081 is located where the front surface 1085 transitions between the contact surface 112 and the tapered region 1082.

Furthermore, this embodiment of the superstrate 108 also includes a beveled region 1084 on the upper side 1086 of the superstrate 108. In a radial direction from the center of the superstrate 108 toward the edge 1083 of the superstrate 108, the beveled region 1084 slopes away (downward in FIG. 2A) from the planar part of the back surface 1086 at angle $\theta_u$.

Thus, the thickness T of the superstrate 108 across the contact surface 112 is greater than the thickness of the superstrate 108 at the edge 1083. Furthermore, in FIG. 2A, the width C' of the tapered region 1082 is greater than the width C of the beveled region 1084. However, in some embodiments, the width C' of the tapered region 1082 is less than the width C of the beveled region 1084. And in some alternative embodiments, the superstrate 108 is a polygon with the edge region illustrated in FIG. 2A along each edge 1083 of the polygon.

Figure 4A:
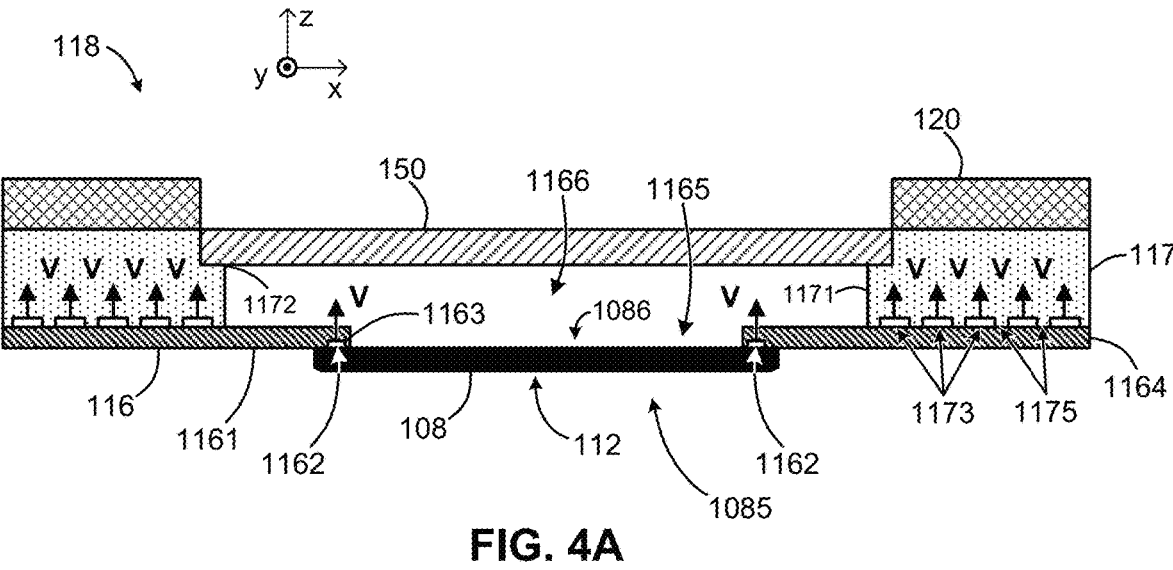
FIGS. 4A and 4B illustrate an example embodiment of a superstrate chuck assembly.
Figure 4B:
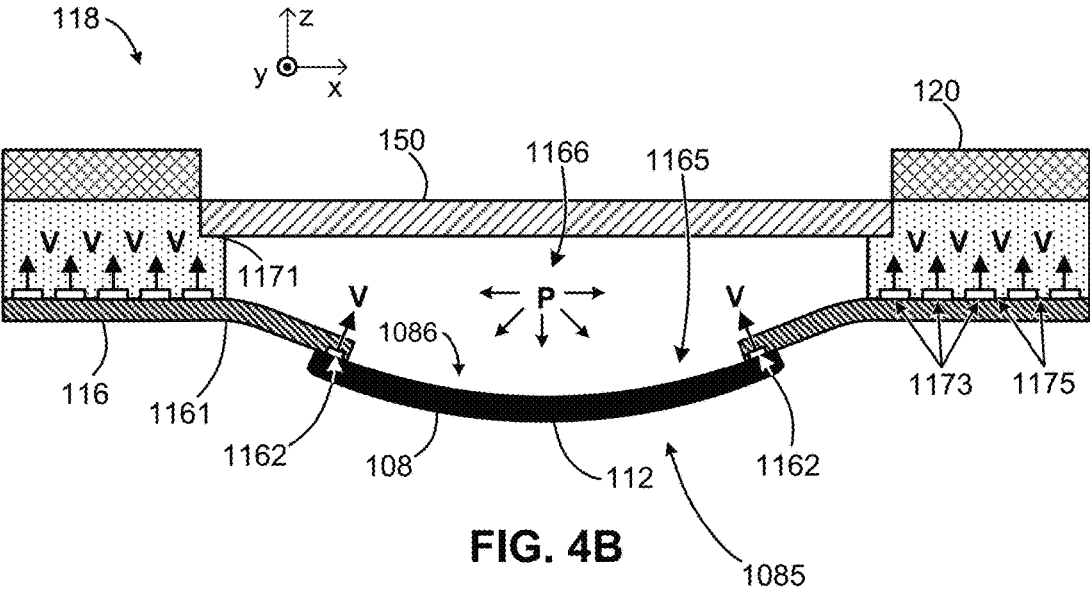

The superstrate 108 is held by a superstrate chuck assembly 118, which is described below in more detail in the description of FIGS. 4A and 4B. The superstrate chuck assembly 118 may be coupled to an imprint head 119, which in turn may be moveably coupled to a frame 120 such that the superstrate chuck assembly 118, the imprint head 119, and the superstrate 108 are moveable in at least the z-axis direction. For example, the head 119 may include one or more actuators, such as voice coil motors, piezoelectric motors, linear motors, nut and screw motors, etc., that are configured to move the superstrate chuck assembly 118 and the superstrate 108 in the z-axis direction. And in some embodiments, the superstrate chuck assembly 118, the imprint head 119, and the superstrate 108 are also movable in one or more of the x- and y-axes directions and one or more of the θ, ψ, and φ angles.

The imprint system 100 may include one or more motors or actuators that move the superstrate 108, the superstrate chuck assembly 118, or the imprint head 119. For example, one or more motors may rotate the superstrate 108 about an axis in the x-y plane of the superstrate 108. Rotation of superstrate 108 about an axis in the x-y plane (e.g., a rotation about the x axis, a rotation about the x axis) of the superstrate 108 changes an angle between the x-y plane of the superstrate 108 and the x-y plane of substrate 102, and may be referred herein to as "tilting" the superstrate 108 with respect to the substrate 102, changing a "tilt" or "tilt angle" of the superstrate 108 with respect to the substrate 102, or adjusting the "tilt" or "tilt angle" of the superstrate 108 relative to the substrate 102.

The imprint system 100 also includes a fluid dispenser 122. The fluid dispenser 122 may also be moveably coupled to the frame 120. In some embodiments, the fluid dispenser 122 and the superstrate chuck assembly 118 share one or more positioning components. And in some embodiments, the fluid dispenser 122 and the superstrate chuck assembly 118 move independently of each other. Also, in some embodiments, the fluid dispenser 122 and the superstrate chuck assembly 118 are located in different subsystems of the imprint system 100, and the substrate 102 is moved between the different subsystems.

Different fluid dispensers 122 may use different technologies to dispense the drops of formable material 124. When the formable material is jettable, ink-jet-type fluid dispensers 122 may be used to dispense the drops of formable material 124. For example, thermal ink jetting, microelectromechanical-systems-based (MEMS-based) ink jetting, and piezoelectric ink jetting are technologies for dispensing jettable liquids.

The fluid dispenser 122 may include a fluid-dispense head 127 and fluid-dispense ports. The fluid-dispense ports may have a fixed configuration such that the fluid-dispense head 127 and fluid-dispense ports move as a unit and do not move independently of each other. Thus, the fluid-dispense ports may be fixed relative to one another on the fluid-dispense head 127. The number of fluid-dispense ports can vary between embodiments. For example, some embodiments have at least two fluid-dispense ports, at least three fluid-dispense ports, at least four fluid-dispense ports, at least five fluid-dispense ports, at least ten fluid-dispense ports, at least twenty fluid-dispense ports, or over a hundred fluid-dispense ports. In some embodiments, the fluid-dispense ports include a set of at least three fluid-dispense ports that lie along a line. In some embodiments, the fluid-dispense head 127 includes hundreds of fluid-dispense ports that lie along multiple parallel lines.

When operating, the fluid-dispense ports of the fluid dispenser 122 deposit drops of liquid formable material 124 onto the substrate 102 with the volume of deposited material 124 varying over the area of the substrate 102 based at least in part on its topography profile. And the fluid dispenser 122 may deposit the drops of liquid formable material 124 onto the substrate 102 according to a drop pattern, which can define the distribution of the liquid formable material 124 (e.g., drop locations and drop volumes of the drops of the liquid formable material 124) on the substrate 102. The formable material 124 may be, for example, a resist (e.g., photo resist) or another polymerizable material, and the formable material 124 may comprise a mixture that includes a monomer. The drops of formable material 124 may be dispensed upon the substrate 102 before or after a desired field volume is defined between the contact surface 112 and the substrate 102, depending on the embodiment. The field volume indicates the volume of formable material 124 required to produce all of the desired features on the substrate 102 (e.g., the volume required to cover the topography 1021 with, for example, a planar surface).

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The imprint system 100 also includes an energy source 126 that directs actinic energy (e.g., ultraviolet (UV) radiation) along an exposure path 128. The imprint head 119 and the substrate positioning stage 107 may be configured to position the superstrate 108 and the substrate 102 on (e.g., in superimposition with) the exposure path 128. The energy source 126 sends the actinic energy along the exposure path 128 after the superstrate 108 has contacted the formable material 124. For illustrative purposes, FIG. 1 shows the exposure path 128 when the superstrate 108 is not in contact with the formable material 124 so that the relative positions of the individual components can be easily identified. However, the exposure path 128 does not substantially change when the superstrate 108 is brought into contact with the formable material 124.

The imprint system 100 also includes at least one imaging device 136 (e.g., camera). FIG. 1 illustrates an optical axis 137 of the imaging device's imaging field. As illustrated in FIG. 1, the imprint system 100 may include one or more optical components (e.g., dichroic mirrors, beam combiners, prisms, lenses, mirrors) that combine the actinic energy with light to be detected by the imaging device 136. Also, the imaging device 136 may be positioned such that an imaging field of the imaging device 136 includes the superstrate 108 and such that the imaging field is in superimposition with at least part of the exposure path 128. Accordingly, the imaging device 136 may be positioned to view the spread of formable material 124 as the superstrate 108 contacts the formable material 124 during the planarization process.

Additionally, the imaging device 136 may include one or more of a CCD sensor, a CMOS sensor, a sensor array, a line camera, and a photodetector that are configured to gather light at a wavelength that shows a contrast between regions underneath the superstrate 108 and in contact with the formable material 124 and regions underneath the superstrate 108 but not in contact with the formable material 124. And the imaging device 136 may be configured to provide images of the spread of formable material 124 underneath the superstrate 108 or of the separation of the superstrate 108 from cured formable material 124. The imaging device 136 may also be configured to measure interference fringes, which change as the formable material 124 spreads between the gap between the contact surface 112 and the substrate surface.

In operation, once the drops of formable material 124 have been deposited on the substrate 102, either the imprint head 119, the substrate positioning stage 107, or both vary a distance between the superstrate 108 and the substrate 102 to define a desired space (a field volume) that is filled by the formable material 124. For example, the imprint head 119 can apply a force to the superstrate 108 that moves the contact surface 112 of the superstrate 108 into contact with the drops of formable material 124 that are on the substrate 102 such that the formable material 124 spreads on the substrate 102. As the superstrate 108 contacts the drops of formable material 124, the drops merge to form a formable-material film that fills the space between the superstrate 108 and the substrate 102. Preferably, the filling process happens in a uniform manner without any air or gas bubbles being trapped between the superstrate 108 and the substrate 102 in order to minimize non-fill defects.

After the desired field volume is filled with the formable material 124, the energy source 126 produces energy (e.g., actinic radiation) that is directed along the exposure path 128 to the formable material 124 and that causes the formable material 124 to cure (e.g., solidify, cross-link) in conformance to a shape of the substrate's topography 1021 and a shape of the contact surface 112. The formable material 124 can be cured while the superstrate 108 is in contact with the formable material 124, thereby forming a planarized surface on the substrate 102. Once a cured, planarized layer is formed on the substrate 102, the superstrate 108 can be separated therefrom. And the substrate 102 and the cured, planarized layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices).

Figure 3A:
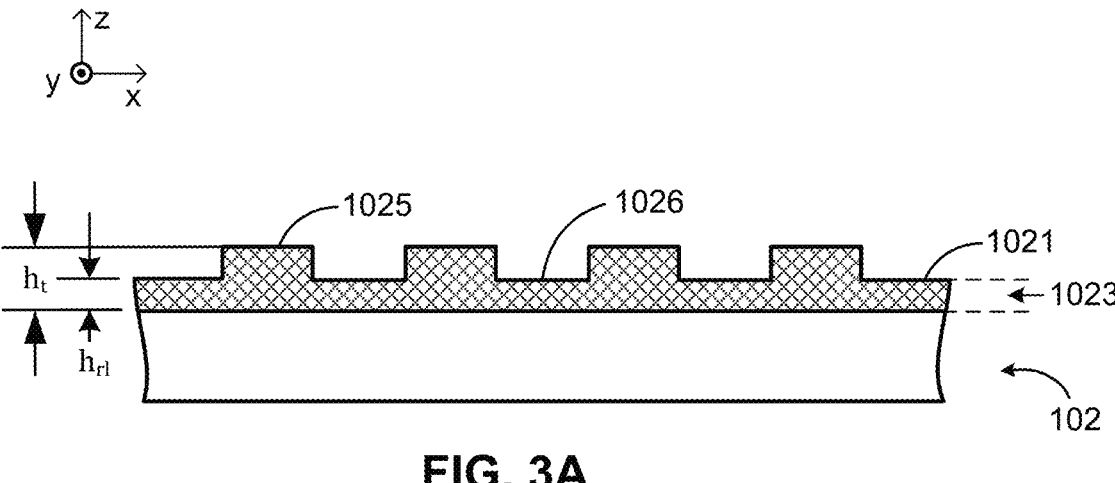
FIG. 3A illustrates an example embodiment of a topography on a substrate.

In embodiments of the imprint system 100 that perform IAP, the substrate 102 may have a topography 1021 (e.g., feature pattern) on its surface. For example, FIG. 3A illustrates an example embodiment of a topography 1021 on a substrate 102. In FIG. 3A, the substrate 102 has a topography 1021 on its back surface (which is the surface that is proximal to the superstrate 108). The topography 1021 includes a residual layer 1023 and a plurality of features that are shown as protrusions 1025 and recesses 1026. The protrusions 1025 have an imprint thickness $h_t$, and the residual layer 1023 has a residual layer thickness (RLT) $h_{rl}$.

Figure 3B:
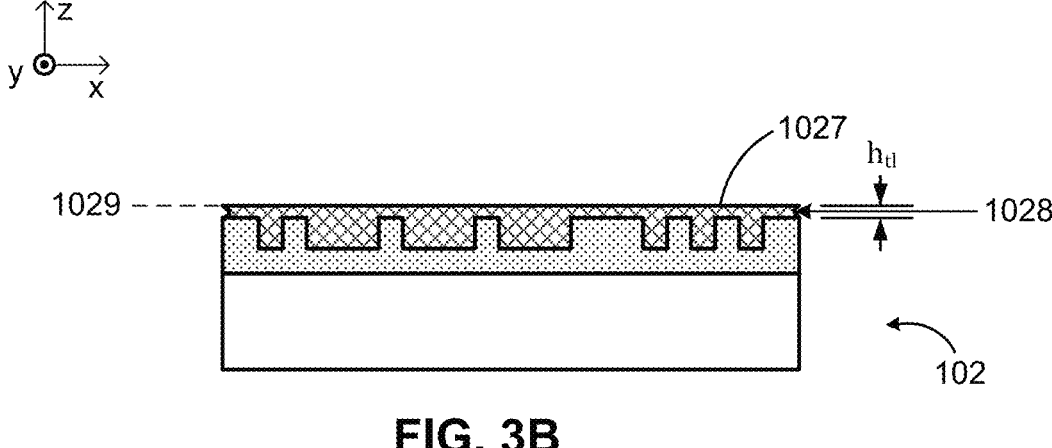
FIG. 3B illustrates an example embodiment of a planarized surface.

The drops of formable material 124 may form a patterned layer that fills the topography 1021 on the substrate 102, and the patterned layer may have a top layer that extends above the substrate 102 and that has a top layer thickness (TLT). Furthermore, the back surface of the top layer may be featureless and planar. For example, FIG. 3B illustrates an example embodiment of a planarized surface. FIG. 3B shows a planarized patterned layer 1027 that has been formed on a substrate 102, which includes recesses and protrusions. The patterned layer 1027 fills in the recesses and protrusions in the substrate 102. The top layer 1028 of the planarized patterned layer 1027, which may be referred to as the overburden, is formed above the substrate 102 and has a top layer thickness (TLT) $h_{tl}$. Also, a back surface 1029 of the top layer 1028 is featureless and planar.

The imprint system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, the imaging device 136, or the sensor 141, and may operate based on instructions in a computer-readable program stored in one or more computer-readable storage media 134. In some embodiments, including the embodiment in FIG. 1, the one or more processors 132 and the one or more computer-readable storage media 134 are included in a control device 135. The control device 135 regulates, controls, or directs the operations of the imprint system 100.

Each of the one or more processors 132 may be or may include one or more of the following: a central processing unit (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processor (DSP); a specially-configured computer; and other electronic circuitry (e.g., other integrated circuits). For example, a processor 132 may be a purpose-built controller or may be a general-purpose controller that has been specially-configured to be an imprint-system controller.

Examples of computer-readable storage media 134 include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

In the embodiment in FIG. 1, the control device 135 may operate as a drop-pattern-generation device, which generates one or more drop patterns (dispense patterns), and the control device 135 may obtain the one or more drop patterns from another device (e.g., a drop-pattern-generation device) that generated (or that store) the one or more drop patterns. For example, the one or more processors 132 may be in communication with a networked computer on which analysis is performed and control files, such as drop patterns, are generated. A drop pattern indicates where the fluid dispenser 122 should deposit drops of liquid formable material 124 onto the substrate 102. A drop pattern may be generated based, at least in part, on a field volume or on a feature pattern 1021 of the substrate 102. Also, to account for the feature pattern 1021 of the substrate 102, the drop density of the drop pattern may vary across the substrate 102. And the drop pattern may have a uniform drop density over regions of the substrate 102 that have a uniform density (e.g., blank areas, or areas where the feature pattern 1021 has a uniform feature density).

The imprint system 100 also includes a substrate-heating subsystem 166 (which is an example of a substrate heating unit). The substrate-heating subsystem 166 deforms a region on the substrate 102 by heating the region on the substrate 102, and the heating may be performed before any formable material 124 has been deposited on the substrate 102, before formable material 124 that has been deposited on the substrate 102 is imprinted, before formable material 124 that has been deposited on the substrate 102 is cured, or while formable material 124 that has been deposited on the substrate 102 is cured.

The substrate-heating subsystem 166 includes a heating light source 167, which irradiates the substrate 102 with light to heat the substrate 102; an adjusting unit 168, which adjusts the irradiation amount (irradiation amount distribution) of the light; and a reflecting plate 169, which defines an optical path to guide light from the adjusting unit 168 to the substrate 102. In an alternative embodiment, the substrate heating subsystem 166 is a heat source which may or may not include the heating light source 167 and is incorporated into the substrate chuck 104.

The heating light source 167 emits light that has a wavelength to which the formable material 124, as an ultraviolet curing resin material, is not photosensitive (not cured), for example, light in a wavelength band of 400 nm to 2,000 nm. For heating efficiency, some embodiments of the heating light source 167 emit light in a wavelength band of 500 nm to 800 nm. However, some embodiments of the heating light source 167 emit light in other wavelength bands. Also, in some embodiments, the heating light source 167 is a laser, such as a high-power laser.

The adjusting unit 168 allows only specific light of the emitted light to irradiate the substrate 102 in order to form a predetermined irradiation-amount distribution on the substrate 102. In some embodiments, the adjusting unit 168 includes one or more spatial light modulators (SLMs). An example of an SLM is a mirror array having an array of a plurality of mirrors, each including a drive axis, which may be referred to as digital mirror device (DMD), such as a digital micro-mirror device. A DMD can control (change) an irradiation amount distribution by individually adjusting the plane direction of each mirror.

Furthermore, the imaging device 136 can detect (capture images of) alignment marks and overlay marks. Substrates 102 and superstrates 108 may include corresponding pairs of alignment marks that allow real-time alignment of the superstrates 108 and the substrates 102. After a superstrate 108 is positioned over a substrate 102 (e.g., superimposed over the substrate 102), the control device 135 determines an alignment of the superstrate-alignment marks with respect to the substrate-alignment marks based on the signals (e.g., images) from the imaging device 136. Alignment schemes may include measurement of alignment errors associated with pairs of corresponding alignment marks, followed by compensation of these errors to achieve accurate alignment of the superstrate 108 and a desired imprint location on the substrate 102.

Additionally, substrates 102 and superstrates 108 may include corresponding pairs of overlay marks that allow for assessment of and compensation for overlay errors in imprinted substrates 102. Overlay marks in a superstrate 108 are transferred to the polymeric layer (patterned layer 1027) during polymerization of the formable material 124, yielding a planarized (or imprinted) substrate 102 with corresponding pairs of overlay marks. The control device 135 may assess overlay errors of corresponding pairs of overlay marks in an imprinted substrate 102 to determine in-plane and out-of-plane contributions to overlay errors. In some alternative embodiments, the superstrate 108 does not have any superstrate-alignment marks, and alignment is based on a superstrate edge 1083 or a contact surface 112 of the superstrate 108. Also, some embodiments include super-strate-alignment marks and also can perform alignment based on a superstrate edge 1083 or a contact surface 112 of the superstrate 108.

And, as noted above, one or both of the substrate positioning stage 107 and the imprint head 119 can be moved (e.g., translated, rotated) to change the relative positions of the substrate 102 and the superstrate 108. Also, the tilt of the superstrate 108 (or, in some embodiments, the tilt of the substrate 102) can be adjusted. For example, the imprint system 100 may include actuators (or other devices) that can translate the superstrate 108 about orthogonal axes (the x and y axes in FIG. 1) in the plane of the superstrate 108, rotate the superstrate 108 about an axis orthogonal to the plane (the z axis in FIG. 1), or both. Also for example, some embodiments of the imprint system 100 may translate the superstrate 108 along the z axis and rotate the superstrate 108 about an axis in the plane of the superstrate 108 (the x and y axes in FIG. 1).

As noted above, the imprint system 100 also includes a superstrate chuck assembly 118. FIGS. 4A and 4B illustrate an example embodiment of a superstrate chuck assembly 118 (chuck assembly 118). The chuck assembly 118 includes a member 116 (e.g., a flexible ring portion), which may have an annular shape (e.g., a circular shape) or another shape that is formed from the region between two concentric polygons (e.g., squares, rectangles). Thus, the member 116 has both an inner perimeter 1163 and an outer perimeter 1164 and has a central opening 1165. And the shape of the outer perimeter 1164 or the inner perimeter 1163 of the member 116 may be the same as, or similar to, the shape of the superstrate 108. Also, the member 116 may be made of a transparent material that allows UV light to pass through or may not be made of a transparent material that allows for UV light to pass through. Thus, the member 116 may or may not be composed of a material that is opaque to UV light. Also, the member 116 may be composed of a plastic (e.g., acrylic), a glass (e.g., fused silica, borosilicate), metal (e.g., aluminum, stainless steel), or a ceramic (e.g., zirconia, sapphire, alumina).

The member 116 may include a flexible portion 1161. As discussed below in more detail, the size or shape of the flexible portion 1161 of the member 116 may be varied, for example while performing the planarization process or while registering the substrate 102 to the superstrate 108.

For example, the thickness of the member 116, including the flexible portion 1161, may be from 0.2 to 5 mm or 0.3 to 2 mm in some embodiments. Also for example, the length of the flexible portion 1161 at a point in the process when the flexible portion 1161 is shortest may be 10 mm to 200 mm or 20 to 75 mm in some embodiments. And, for example, the ratio of the length of the flexible portion to the thickness of the flexible portion may be 1000:1 to 2:1 in some embodiments. In some example embodiments, the ratio of the length of the flexible portion to the thickness of the flexible portion may be 5:1 to 200:1. A thicker material with a low elastic modulus will be similarly flexible as a thin material with high elastic modulus. The member 116 may be composed of a material having a modulus of elasticity (Young's modulus) of 1 to 210 GPa, 50 to 150 GPa, or 60 to 100 GPa. In some embodiments, the modulus of elasticity may be 70 GPa.

Some example embodiments of the member 116 have a flexural rigidity of 0.01 to 5 Pa·m³, 0.1 to 4 Pa·m³, 0.5 to 3 Pa·m³, 1.0 to 2 Pa·m³. Additionally, a ratio of the flexural rigidity of the member to the flexural rigidity of the superstrate may be 0.01:1 to 5:1, 0.05:1 to 4:1, 0.1:1 to 3:1, or 0.5:1 to 1:1, and may preferably be less than 1:1 in some embodiments. Equation (1) below defines the flexural rigidity D:

$$D = \frac{EH^3}{12(1 - v^2)}, \tag{1}$$

where H is the thickness of the superstrate 108 or the flexible portion 1161 of the member 116; where v is Poisson's ratio of the material of the superstrate 108 or the flexible portion 1161 of the member 116; and where E is Young's modulus of the material of the superstrate 108 or the flexible portion 1161 of the member 116. For example, the flexural rigidity for the superstrate 108 may be 2.12, while the flexural rigidity of the flexible portion 1161 of the member 116 may be 0.29, 0.68, 0.82, or 2.30 Pa·m³. And, for example, the ratio of the flexural rigidity of the flexible portion 1161 of the member 116 to the flexural rigidity of the superstrate 108 may be 0.14:1, 0.32:1, 0.39:1, or 1.09:1.

The member 116 may further include a superstrate-holding cavity 1162 configured to hold a portion of the superstrate 108 to the flexible portion 1161 of the member 116. For example, in some embodiments the superstrate-holding cavity 1162 is annular cavity that concentrically surrounds the central opening 1165. The superstrate-holding cavity 1162 may be located adjacent to the edge of the inner perimeter 1163 of the member. And the superstrate-holding cavity 1162 may be formed as a recessed portion in the flexible portion 1161. In some embodiments, the inner diameter of the member 116 is smaller or the superstrate-holding cavity 1162 has additional lands.

The chuck assembly 118 may further include a light-transmitting member 150 that covers the central opening 1165 of the member 116. In some embodiments, the light-transmitting member 150 is transparent to UV light with high UV light transmissivity. That is, the material composition of the light-transmitting member 150 may be selected such that UV light used to cure the formable material passes through the light-transmitting member 150. In some embodiments in which the light-transmitting member 150 transmits UV light, the light-transmitting member 150 is composed of a material (e.g., sapphire, fused silica) that transmits greater than 80% of light having a wavelength of 310-700 nm (i.e., UV light and visible light). And in some embodiments, the light-transmitting member 150 is not transparent to UV light. When the light-transmitting member 150 is not transparent to UV light, the light-transmitting member 150 may be composed of a material (e.g., glass, borosilicate) that transmits greater than 80% of light having a wavelength of 400-700 nm (i.e., visible light). That is, in embodiments in which it does not transmit UV light, the light-transmitting member 150 may be able to transmit visible light. Also, the light-transmitting member 150 may transmit light that is emitted by the heating light source 167.

Furthermore, the chuck assembly 118 may include a second cavity 1166 that is defined, at least in part, by the member 116 and the light-transmitting member 150. An underside surface of the light-transmitting member 150, a back surface of the member 116, and the back surface 1086 of the superstrate 108 together define the second cavity 1166. The second cavity 1166 may be further defined by the inner side wall of a support ring 117, which is described in more detail below.

And the chuck assembly 118 may further include a fluid path in communication with the second cavity 1166 for pressurizing the second cavity 1166. As used herein, pressurizing includes both positive pressurizing and negative pressurizing. The fluid path can also be used to open the second cavity 1166 to the surrounding atmosphere. Also, the fluid path is in communication with one or more pressure sources or vacuum sources (e.g., pumps) or includes one or more ports that can be coupled to pressure sources or vacuum sources. And the fluid path may include components (e.g., one or more valves) that together allow the second cavity 1166 to be selectively positively or negatively pressurized.

The superstrate 108 may be held by the flexible portion 1161 by reducing the pressure in the superstrate-holding cavity 1162. One manner of reducing the pressure in the superstrate-holding cavity 1162 is to produce a vacuum in the superstrate-holding cavity 1162. In order to also produce a vacuum in the superstrate-holding cavity 1162 of the member 116, the chuck assembly 118 may further include a path (also referred herein as a vacuum path) in communication with the superstrate-holding cavity 1162 and in communication with a vacuum source. In a case that there is already a pressure differential within the assembly relative to the atmosphere around the assembly, the vacuum path can be used as a manner of reducing pressure in the superstrate-holding cavity 1162 without being coupled to a vacuum source. The vacuum path may include components (e.g., valves) that together allow the superstrate-holding cavity 1162 to impart a vacuum onto the superstrate 108.

One or more additional vacuum paths may be implemented that have the same structure as the above-described vacuum path, where each vacuum path is in communication with the same superstrate-holding cavity 1162 or in communication with a corresponding additional superstrate-holding cavity (not shown) formed in the member 116. The additional superstrate-holding cavity or superstrate-holding cavities may be disposed concentrically around the superstrate-holding cavity 1162. That is, the additional superstrate-holding cavity or superstrate-holding cavities may also be concentrically disposed around the central opening 1165, but may be located at a greater radial distance from the inner perimeter 1163 than the illustrated superstrate-holding cavity 1162. Also for example, an additional vacuum path having the same structure as the vacuum path may be located at a position diametrically opposing the vacuum path. The additional superstrate-holding cavity or superstrate-holding cavities may be used to assist in separating the superstrate 108 from a cured layer as part of the planarization process. And the additional superstrate-holding cavity or superstrate-holding cavities allow the same chuck assembly 118 to be used with different-sized superstrates.

In some embodiments, the superstrate-holding cavity 1162 and the vacuum path are replaced with another mechanism for coupling the member 116 with a superstrate 108. For example, in place of a cavity-vacuum arrangement, an electrode that applies an electrostatic force may be included. Another option is mechanical latching where a mechanical structure on the underside of the member 116 is mateable with the superstrate 108.

The chuck assembly 118 may further include a support ring 117. The support ring 117 does not need to be made of a transparent material that allows for UV light to pass through. Thus, the support ring 117 may be composed of a material that is opaque to UV light. For example, the support ring 117 may be composed of plastic (e.g., acrylic), glass (e.g., fused silica, borosilicate), metal (e.g., aluminum, stainless steel), or ceramic (e.g., zirconia, sapphire, alumina). In some embodiments, the support ring 117 is composed of the same material as the member 116.

The support ring 117 may include a circular (or polygonal shaped) main body defining an open central area, and the shape of the support ring 117 may be the same as, or similar to, the shape of the member 116. The outer circumference of the support ring 117 may be uniform. The inner circumference 1171 of the support ring 117 may include a step that provides a receiving surface 1172 for receiving the light-transmitting member 150. Accordingly, the light-transmitting member 150 may be placed onto the receiving surface 1172 of the step, thereby covering the central area. The light-transmitting member 150 may be secured onto the receiving surface 1172, for example using an adhesive. Thus, when the light-transmitting member 150 is placed or secured onto the receiving surface 1172 and when a superstrate 108 is held by the member 116, the second cavity 1166 is defined by the underside surface of the light-transmitting member 150, the inner circumference 1171 of the support ring 117, the back surface of the member 116, and the back surface 1086 of the superstrate 108.

The member 116 may be coupled to the underside surface of the support ring 117 using a coupling member (not shown), such as a screw, nut, bolt, adhesive, and the like. The coupling member may be located adjacent the outer edge of the support ring 117 and adjacent the outer edge of the member 116. When the coupling member is a screw, the coupling member may pass through the member 116 adjacent to the outer edge and into the support ring 117 adjacent to the outer edge. When the coupling member is an adhesive, the coupling member may be located between the member 116 adjacent to the outer edge and the support ring 117 adjacent to the outer edge. In this manner, a back surface of the member 116 contacts and is fixed to the underside surface of the support ring 117 adjacent their outer edges.

Additional surface area of the member 116 may be selectively coupled to the support ring 117. The chuck assembly 118 may include additional vacuum paths that allow the member 116 to be selectively secured to the underside surface of the support ring 117. The additional vacuum paths that allow the member 116 to be selectively secured to the underside surface of the support ring 117 may be annular cavities 1173 in the support ring 117 that are open on the underside surface of the support ring 117. When the additional vacuum paths are connected to a vacuum source (e.g., a vacuum pump), and the upper side surface of the member 116 is in contact with the underside surface of the support ring 117, a vacuum can be applied to the annular cavities 1173 of the support ring 117 to secure the member 116 to the support ring 117.

Because the annular cavities 1173 have different radial locations, each of the annular cavities 1173 will apply a suction force to a different section of the upper side surface of the member 116. Furthermore, in embodiments in which each of the annular cavities 1173 are in communication with a respective vacuum source (e.g., vacuum pump) via a respective distinct vacuum path or the annular cavities 1173 are independently selectable (e.g., using one or more valves), vacuums can be independently applied to each of the annular cavities 1173. And if a vacuum is applied only to one of the annular cavities 1173, then the suction force will only be imparted on the section of upper side surface of the member 116 that contacts that annular cavity 1173. However, if a vacuum is applied to two or more of the annular cavities 1173 at the same time, then suction force will be imparted on a larger section of the upper side surface of the member 116, the larger section being formed by the sections of the upper side surface of the member 116 that contact the two or more of the annular cavities 1173 to which the vacuum is applied.

The number of the annular cavities 1173 may be selected to provide the optimal control over how much surface area of the member 116 is suctioned underneath the support ring 117. For example, in some embodiments, the number of annular cavities 1173 ranges from 1 to 10, from 3 to 7, or from 4 to 6. And the annular cavities 1173 may have varying sizes. Also, for example, the ratio of the cross sectional area of one of the annular cavities 1173 to the cross sectional area of another one of the annual cavities 1173 may be from 10:1 to 1:1, from 8:1 to 4:1, or from 5:1 to 3:1. Some of the annular cavities 1173 may have the same size and shape. And, in some embodiments, the annular cavities 1173 have a cross-sectional shape that is rectangular (e.g., as shown in FIGS. 4A and 4B), square, or semi-circular. The support ring 117 may further include lands 1175 between adjacent annular cavities. The lands 1175 are the portions of the support ring 117 that come into contact with the back surface of the member 116.

The shape of the superstrate 108 may be changed by pressurizing (e.g., positively pressurizing, negatively pressurizing) the second cavity 1166. For example, FIG. 4B illustrates a cross-sectional view of an example embodiment of the superstrate chuck assembly 118 and the superstrate 108 when the second cavity 1166 is positively pressurized with pressure P.

The amount of pressure P may be selected such that it is sufficient to outwardly bow the superstrate 108 with a desired curvature. Consequently, the back surface 1086 of the superstrate 108 forms a concave surface, and the front surface 1085 of the superstrate 108 forms a convex surface. For example, in some embodiments the pressure P is set to 0.1 to 10 kPa. At the same time, vacuum suction is applied to all of the annular cavities 1173 and the superstrate-holding cavity 1162. Thus, the member 116 remains attached to the superstrate 108 via the superstrate-holding cavity 1162, and the member 116 remains attached to the support ring 117 across the width to maintain the inflexible portion and the flexible portion 1161. Also, because of the positive pressure P and the bowing of the superstrate 108, the flexible portion 1161 of the member 116 will bend or bow outwardly as well. The second cavity 1166 may be positively pressurized with pressure P prior to moving the chuck assembly 118 toward the substrate 102 or as the chuck assembly 118 moves toward the substrate 102.

Figure 5:
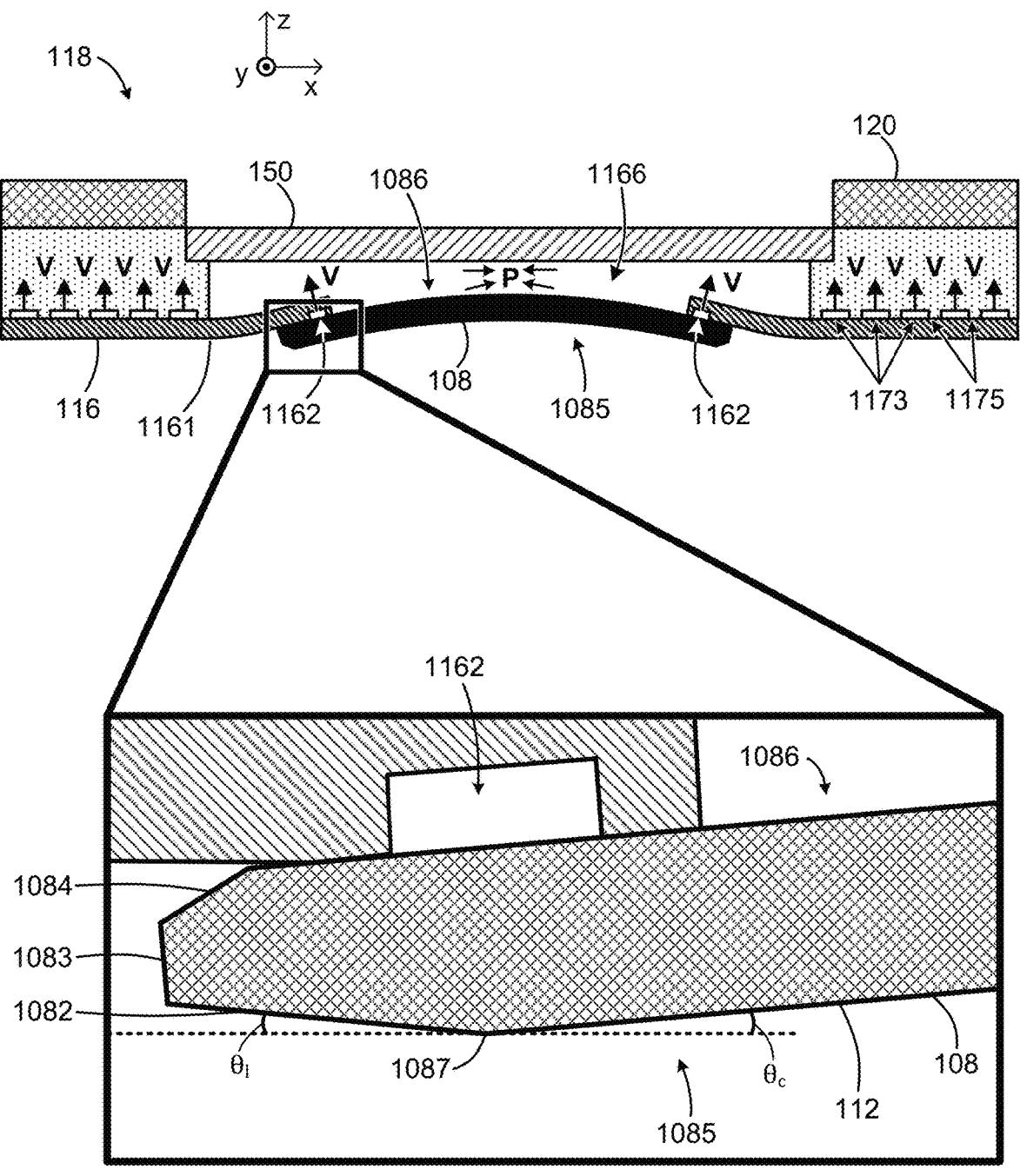
FIG. 5 illustrates an example embodiment of a superstrate chuck assembly that is holding a superstrate that is bowing inward.

Also, the second cavity 1166 may be negatively pressurized with pressure P to inwardly bow the superstrate 108 with a desired curvature and to inwardly bend or bow the flexible portion 1161 of the member 116. For example, FIG. 5 illustrates an example embodiment of a superstrate chuck assembly 118 that is holding a superstrate 108 that is bowing inward. The negative pressure is applied to the back surface 1086 (including a central portion of the back surface 1086) of the superstrate 108. Also, because of the negative pressure P and the inward bowing of the superstrate 108, the flexible portion 1161 and the superstrate-holding cavity 1162 of the member 116 will bend or bow inwardly as well. In FIG. 5, a negative pressure P has been applied to the central portion of the back surface 1086 such that the superstrate 108 is bowed inward and such that the transition boundary 1081 is lower than any other part of the superstrate 108 (i.e., has the lowest z-axis value in FIG. 1). Consequently, the back surface 1086 of the superstrate 108 forms a convex surface, and the front surface 1085 of the superstrate 108 forms a concave surface. And, in some embodiments, the concave surface is formed by the contact surface 112 but not by the tapered region 1082.

The imprint system 100 may apply the negative pressure to the second cavity 1166 (including the back surface 1086, such as the central portion of the back surface 1086) while registering (e.g., aligning) the superstrate 108 to the substrate 102. When the superstrate 108 has a tapered edge (e.g., as shown in FIG. 2A), the sensor 141 and the one or more processors 132 may not be able to consistently or accurately detect the transition boundary 1081.

For example, to detect the transition boundary 1081, the imprint system 100 may use the sensor 141 to detect a surface profile of the front surface 1085 of the superstrate 108 along one or more scanning paths. Each surface profile includes respective distances between a reference location and a location on the front surface 1085 that lies along the corresponding scanning path. The reference location may be a point of reference or a plane of reference (e.g., the sensor 141, a superstrate chuck assembly 118). And the imprint system 100 may interpolate values on the detected surface profile (e.g., increase the measurement resolution) and may smooth the detected surface profile.

Figure 6:
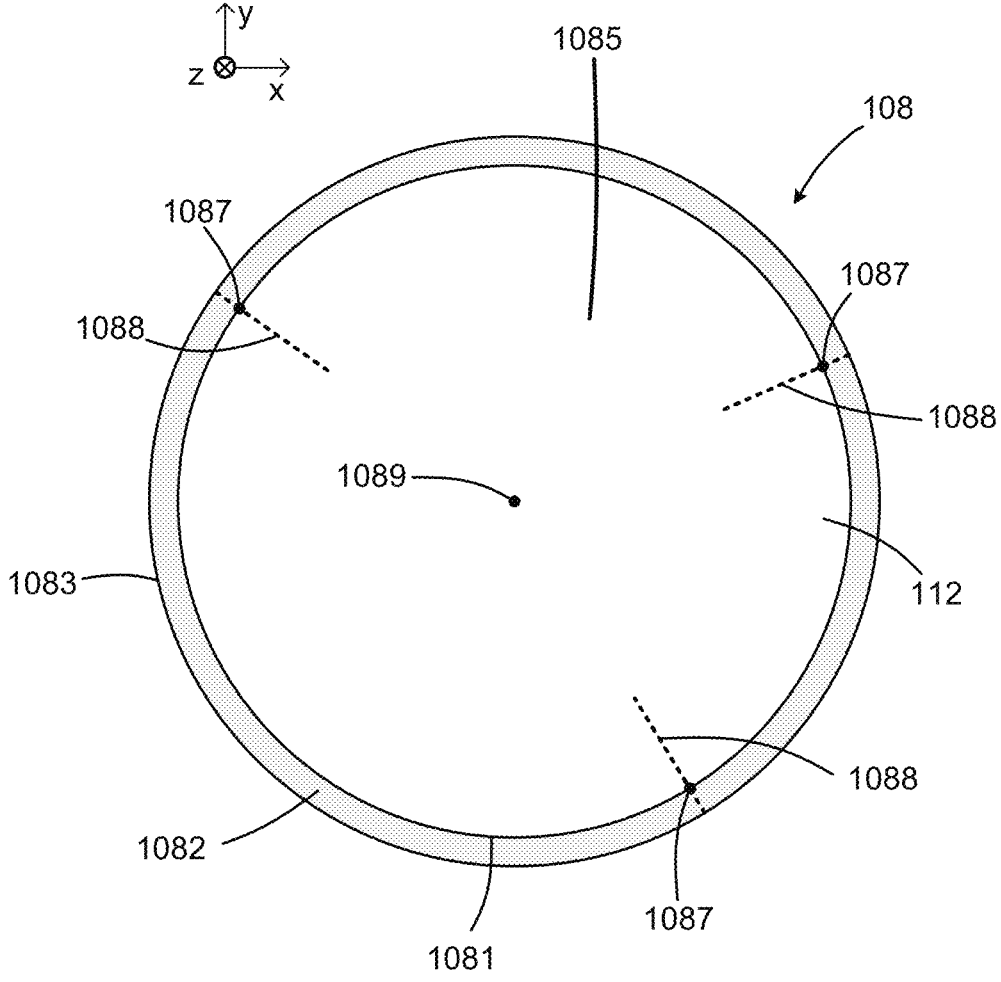
FIG. 6 illustrates example embodiments of scanning paths on a superstrate.

FIG. 6 illustrates example embodiments of scanning paths 1088 on a superstrate 108. Each of the scanning paths 1088 is located on the front surface 1085 at or near a periphery of the superstrate 108 and extends along a radial direction between a center 1089 of the superstrate 108 and the edge 1083. Furthermore, each of the scanning paths 1088 extends across both the contact surface 112 and the tapered region 1082. In this example, the scanning paths 1088 are not equally spaced around the superstrate 108 (i.e., the angles between adjacent scanning paths 1088 are not all the same). However, in some embodiments, the scanning paths 1088 are equally spaced. Also, some embodiments include more or fewer scanning paths 1088. In some embodiments, a scanning path extends in a linear direction (e.g., along the x axis, along the y axis) that is not in a radial direction and extends across both the contact surface 112 and the tapered region 1082.

Figure 7A:
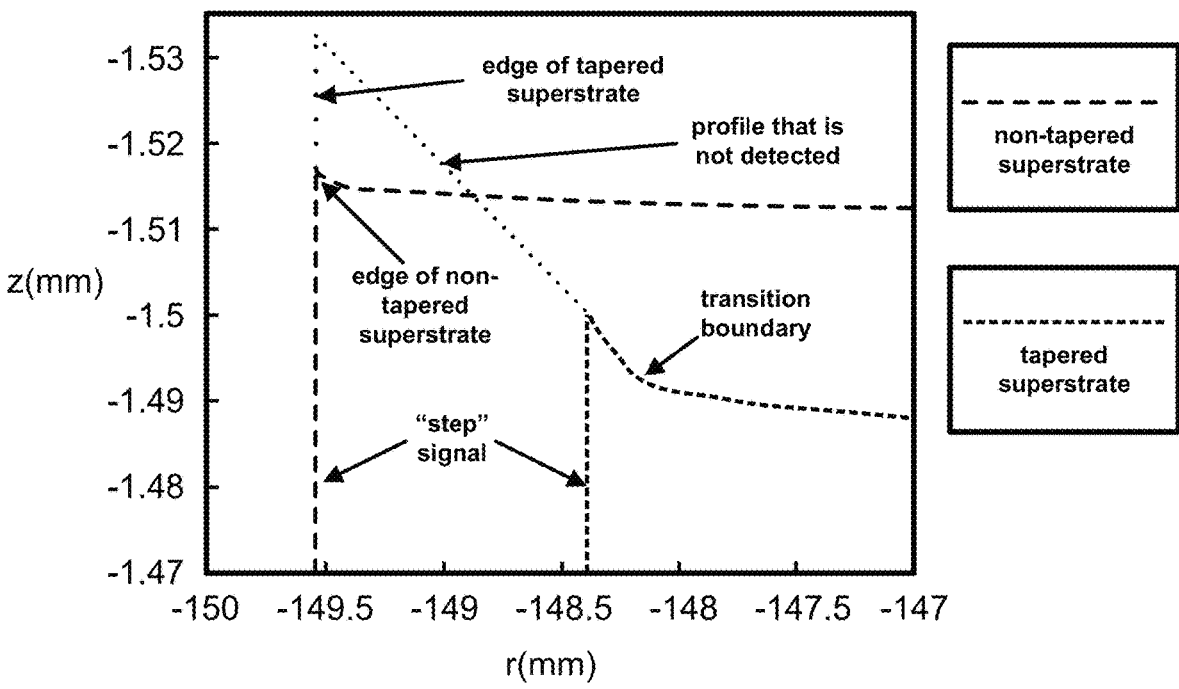
FIG. 7A is a graph that illustrates examples of detected surface profiles.

Also for example, FIG. 7A is a graph that illustrates examples of detected surface profiles. Also, in this example, the surface profiles show the respective distances between the plane of the sensor 141 and locations on the front surfaces of the superstrates that lie along the corresponding scanning paths. And one of the superstrates is non-tapered, and the other superstrate is tapered. Note that the non-tapered superstrate does have a small bevel or curve near the edge.

In this embodiment, the sensor's range includes the non-tapered superstrate 108, but not other members of the system (e.g., the superstrate chuck assembly 118). The surface profile of the non-tapered superstrate 108 shows that when the non-tapered superstrate 108 is within the detection range 1411 of the sensor 141, the sensor 141 detects the front surface 1085 of the non-tapered superstrate 108. But past the edge 1083 of the non-tapered superstrate 108, the sensor 141 no longer detects anything because, in this example, there is not another object (e.g., a superstrate chuck assembly 118) that is within the sensor's detection range 1411. Thus, the sensor 141 cannot detect anything once the non-tapered superstrate 108 is no longer positioned within the detection range 1411 of the sensor 141, and at the edge of the non-tapered superstrate 108, a "step" signal is detected.

FIG. 7A additionally shows the surface profile of a tapered superstrate. In this embodiment, the sensor's range includes the contact surface 112 and part of the tapered region 1082, but does not include the tapered region 1082 near the edge 1083 of the superstrate 108. Also, in some embodiments, the sensor 141 can detect surfaces that are perpendicular to, or are very close to perpendicular to, a detection axis 1412 of the sensor 141 (which is aligned with the z axis in FIG. 1), but the sensor 141 cannot detect surfaces that are not perpendicular to, or not close to perpendicular to, the detection axis 1412 of the sensor 141. The sensor 141 may, for example, have a detection range 1411 of 1 mm and ±3° from the center of the detection range.

Consequently, the sensor 141 cannot accurately detect the surface of the tapered region 1082, and the sensor 141 detects a "step" signal even though the tapered region 1082 is still positioned on the detection axis 1412 of the sensor 141 and within the sensor's detection range 1411. Accordingly, the "step" signal does not indicate the transition boundary 1081 and does not indicate the edge 1083 of the superstrate 108. When the superstrate 108 is large and thin (e.g., as used in IAP), the superstrate 108 may naturally sag under its own weight when it is held only at the periphery with a flexible annular superstrate chuck assembly 118. And furthermore, because of the sagging of the center of the superstrate 108, the transition boundary 1081 is not readily detectable from the surface profile.

Some embodiments of the imprint system 100 apply a negative atmospheric pressure to the second cavity 1166 such that the tapered region 1082 is closer to perpendicular to the detection axis 1411 of the sensor 141 and such that the contact surface 112 is sloped away from the sensor 141 when traveling in an inward radial direction from the transition boundary 1081 to the center 1089 of the superstrate 108. For example, in FIG. 5, angle $\theta_l$ of the tapered region 1082 is decreased, and the contact surface 112 is sloped at angle $\theta_c$ near the transition boundary 1081. This may result in the transition boundary 1081 being the part of the superstrate 108 that is closest to the plane of the sensor 141 along the z axis.

Figure 8:
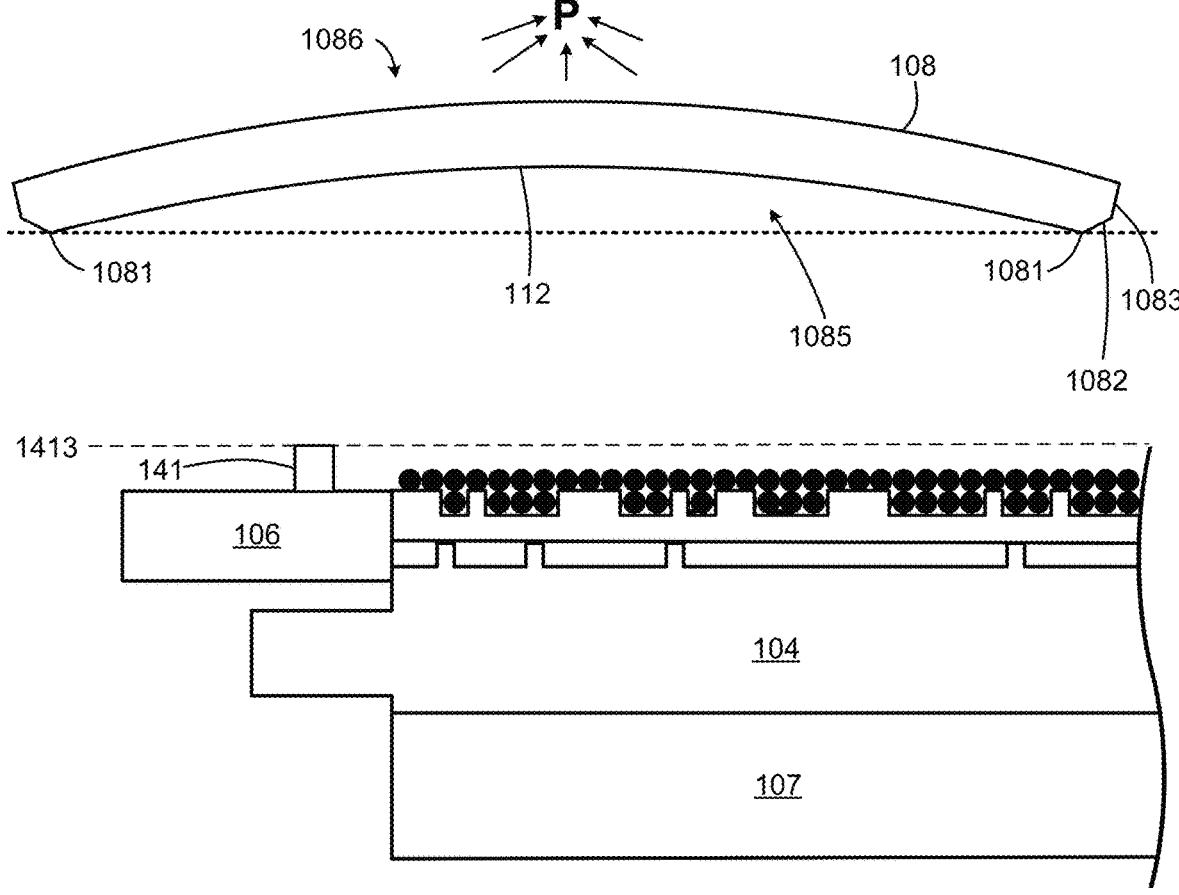
FIG. 8 illustrates an example embodiment of a superstrate 108 when a negative pressure has been applied to the back surface.

For example, FIG. 8 illustrates an example embodiment of a superstrate 108 when a negative pressure has been applied to the back surface 1086 (particularly a central portion of the back surface 1086). The contact surface 112 forms a concave surface, and the transition boundary 1081 is closer to the plane 1413 of the sensor 141 than any other part of the superstrate 108. Thus, the sensor 141 will detect that the transition boundary 1081 is the closest part of the superstrate 108.

Figure 7B:
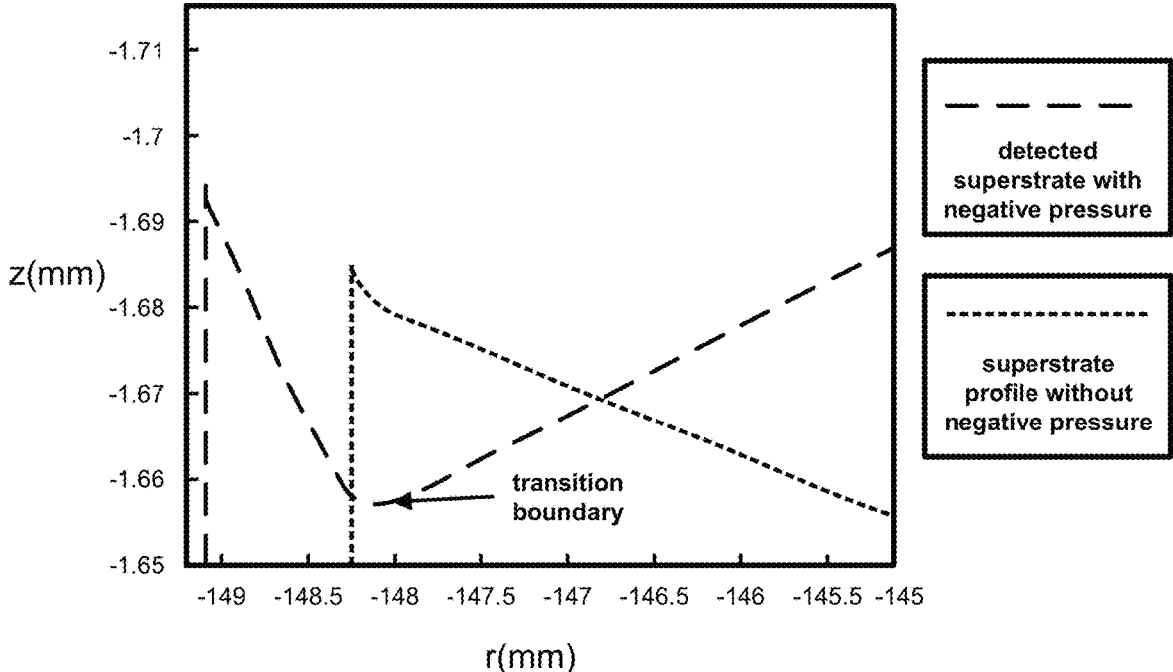
FIG. 7B is a graph that illustrates a detected surface profile of a tapered superstrate when a negative pressure is applied to the second cavity.

FIG. 7B is a graph that illustrates a surface profile of a tapered superstrate 108 that was obtained when a negative atmospheric pressure was applied to the second cavity 1166. Also, for comparison purposes, the graph illustrates the surface profile of the tapered superstrate 108 when the negative atmospheric pressure was not applied to the second cavity 1166 (i.e., when the atmospheric pressure is equal on both the back surface 1086 and the front surface 1085). When viewed in the graph in FIG. 7B, the transition boundary 1081 is located where the slope of the surface profile changes from negative to positive. Also, the transition boundary 1081 is closer to the sensor 141 along the z axis (i.e., the transition boundary 1081 has the lowest detected value in FIG. 7B) than any other part of the superstrate 108. In some embodiments, the surface profile information generated by the sensor 141 may be noisy and require some filtering (spatial and/or temporal) to produce a smooth signal that provides a good characterization of the transition boundary 1081. The imprint system 100 (e.g., the control device 135) detects the transition boundary 1081 based on the surface profile, for example by calculating a derivative of the surface profile or by calculating the point with the lowest value (shortest distance) on the surface profile. And the imprint system 100 (e.g., the control device 135) uses the coordinates of the sensing path 1088 and uses the transition boundary 1081 that was detected in the corresponding surface profile to detect the transition point 1087.

In some embodiments, the imprint system 100 (e.g., the control device 135) detects at least three transition points 1087 from three or more surface profiles that were obtained while applying the negative pressure to the second cavity 1166. The imprint system 100 may move the superstrate 108 and the sensor 141 relative to each other such that a single sensor 141 obtains all of the three or more surface profiles that are used to detect the transition points 1087. And some embodiments of the imprint system 100 include two or more sensors 141, and these embodiments may move the superstrate 108 and the two or more sensors 141 relative to each other to obtain all of the three or more surface profiles that are used to detect the transition points 1087. In some embodiments, the substrate positioning stage 107 moves the one or more sensor(s) 141 relative to the superstrate 108 to detect three or more transition points 1087.

The imprint system 100 can use the three (or more) transition points 1087 to detect the center of the contact surface 112 or to detect the location of the transition boundary 1081 on the front surface 1085 of the superstrate 108. Furthermore, the control device 135 can estimate the superstrate tilt (rotation about the x axis or rotation about the y axis)—particularly the tilt of the contact surface 112—based on the three (or more) transition points 1087.

And the control device 135 can use the center of the contact surface 112 and the coordinates of the perimeter of the contact surface 112 to register the superstrate 108 (particularly the contact surface 112) with the substrate chuck 104 (e.g., by aligning their centers) or to register the superstrate 108 (particularly the contact surface 112) with the substrate 102 (e.g., by aligning the center of the contact surface 112 with the center of the substrate chuck 104). Furthermore, the control device 135 can use the rotation about the x axis or the rotation about the y axis to adjust a tilt of the superstrate 108 (particularly the tilt of the contact surface 112).

FIG. 9 illustrates an example embodiment of an operational flow for registering a superstrate to a substrate chuck (or to a substrate). Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Figure 11:
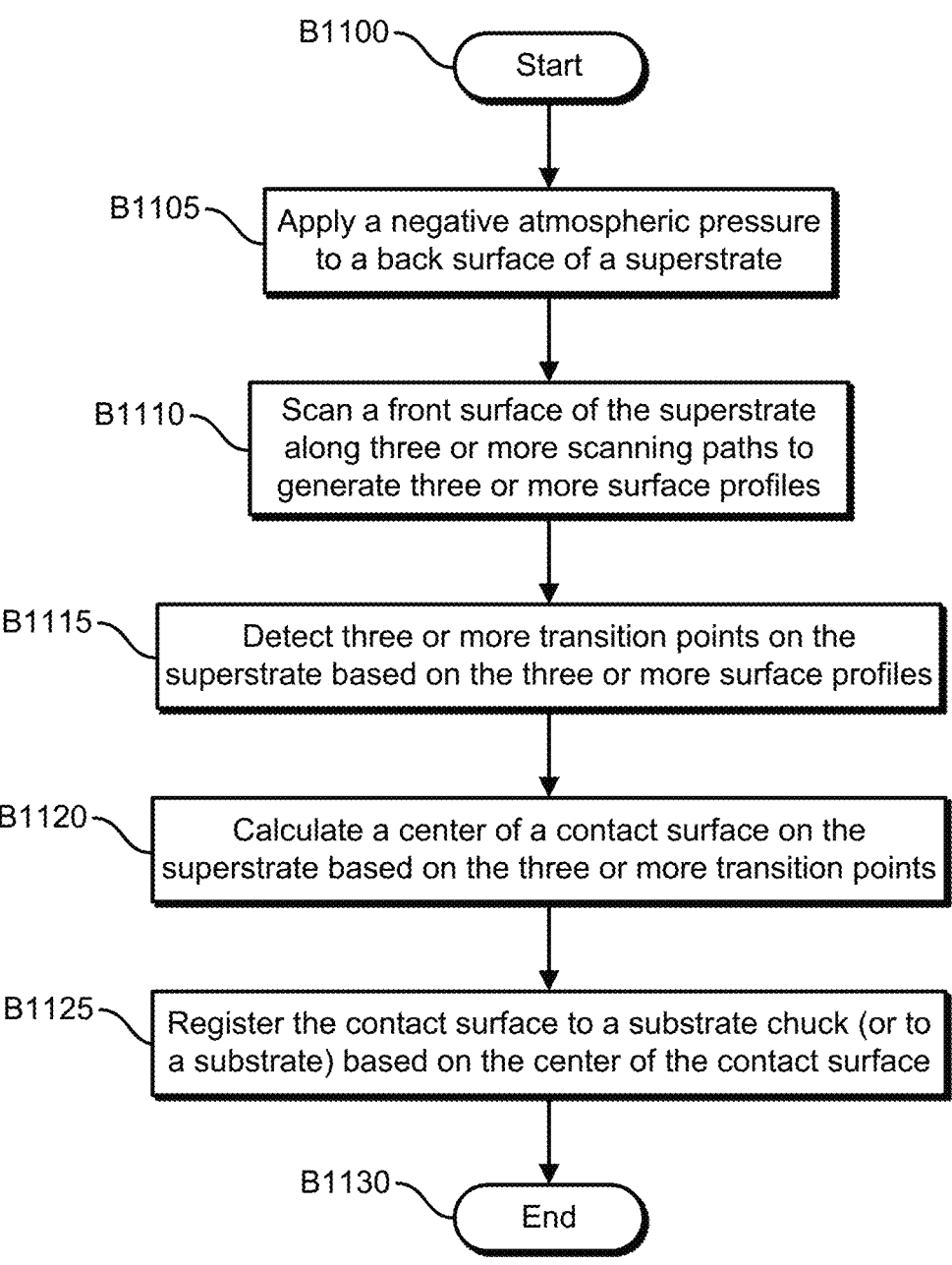
FIG. 11 illustrates an example embodiment of an operational flow for registering a superstrate to a substrate chuck (or to a substrate).
Figure 12:
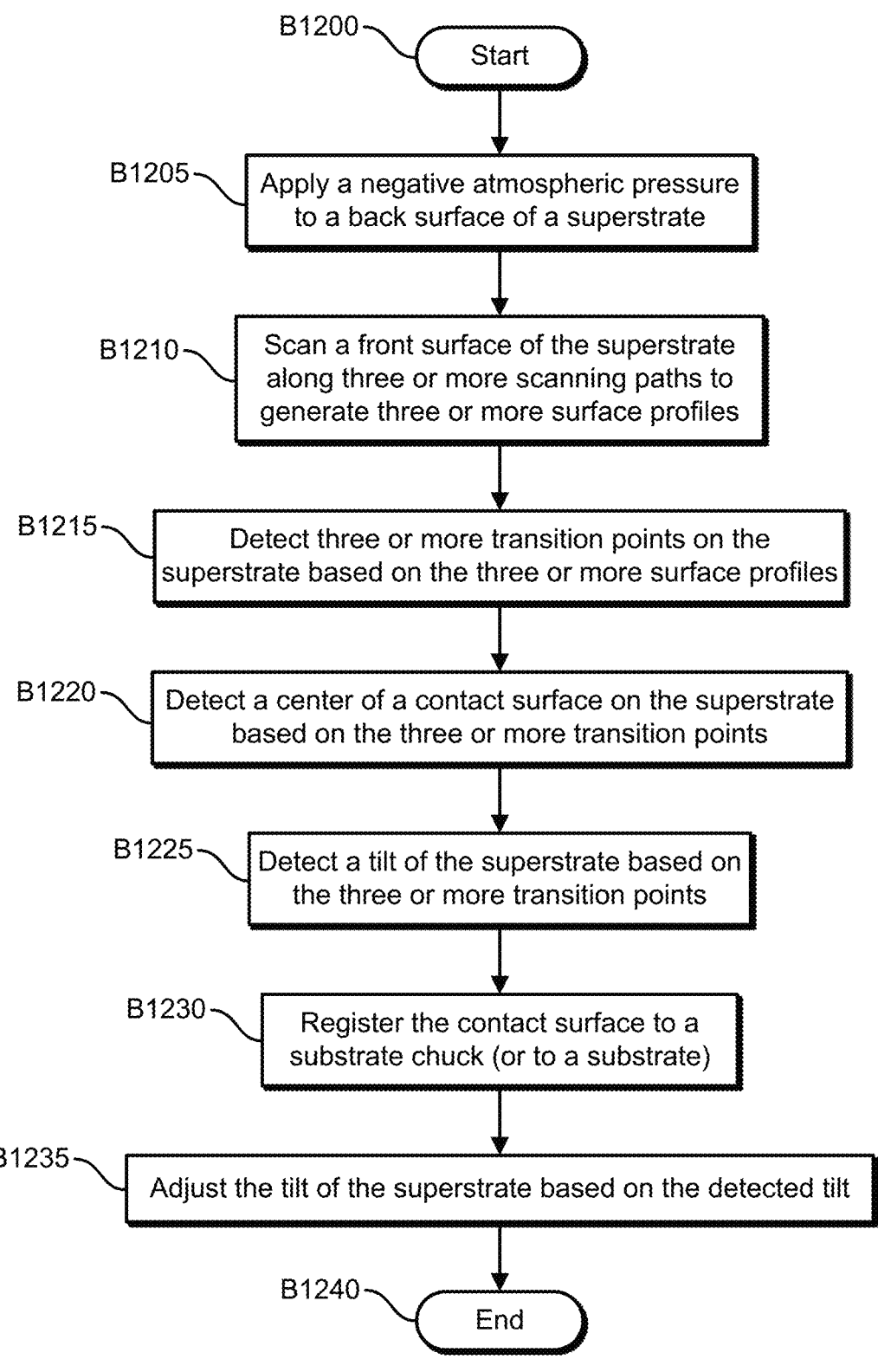
FIG. 12 illustrates an example embodiment of an operational flow for registering a superstrate to a substrate chuck (or to a substrate).

Furthermore, although this operational flow and the operational flows in FIGS. 11 and 12 are performed by an imprint system 100, some embodiments of these operational flows are performed by one or more imprint devices or by one or more other specially-configured computing devices.

In FIG. 9, the flow starts in block B900 and then moves to block B905, where an imprint system 100 applies a negative atmospheric pressure to a back surface 1086 of a superstrate 108 that is held by a superstrate chuck assembly 118. The negative atmospheric pressure may cause the superstrate 108 to bend or bow upwards with a desired curvature. For example, the negative atmospheric pressure may be applied such that a transition boundary 1081 on a front surface 1085 of the superstrate 108 is lower than any other part of the superstrate 108 and such that the back surface 1086 of the superstrate 108 forms a convex surface and at least part of the front surface 1085 (e.g., a contact surface 112) of the superstrate 108 forms a concave surface.

Next, in block B910, the imprint system 100 scans the front surface 1085 of the superstrate 108 along one or more scanning paths 1088 to generate one or more surface profiles of the front surface 1085. For example, the imprint system 100 may move the superstrate 108 relative to one or more sensors 141 such that the one or more sensors 141 scan the front surface 1085 along the one or more scanning paths 1088.

The flow then proceeds to block B915, where the imprint system 100 (e.g., a control device 135 of the imprint system 100) detects one or more transition points 1087 on the front surface 1085 of the superstrate 108 based on the one or more surface profiles. Also, the imprint system 100 may detect a respective transition point 1087 for each surface profile of the one or more surface profiles.

Figure 10:
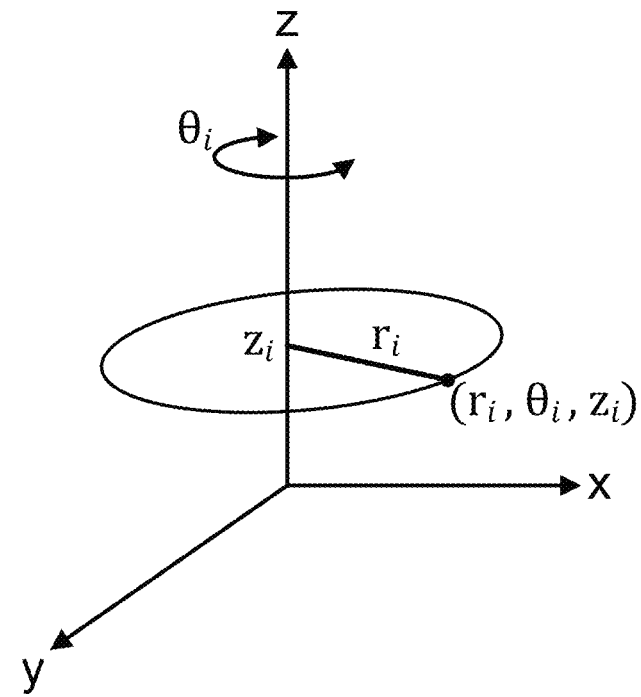
FIG. 10 illustrates an example of a point of a detected surface profile.

For example, some embodiments of the imprint system 100 (e.g., a control device 135 of the imprint system 100) initially represent the surface profiles in respective cylindrical coordinates $(r_i, \theta_i, z_i)$. Each point i of a surface profile is represented by a distance $r_i$ from a reference location, an angle $\theta_i$ around the z axis that is relative to a reference angle around the z axis, and a coordinate $z_i$ on the z axis. An example of a point i of a surface profile is illustrated in FIG. 10. Furthermore, some embodiments of the imprint system 100 up-sample the resolution of the surface profiles based on interpolation, and some embodiments of the imprint system 100 smooth the surface profiles.

The imprint system 100 (e.g., a control device 135 of the imprint system 100) then converts the cylindrical coordinates $(r_i, \theta_i, z_i)$ of the transition points 1087 to Cartesian coordinates $(x_i, y_i, z_i)$, which may be coordinates in a coordinate system that is used by the imprint system 100 or imprint device. The origin of both coordinate systems may the center of the substrate chuck holding surface or a predefined distance above the center of the substrate chuck holding surface. And the imprint system 100 calculates the circle that falls along the transition points 1087 to determine the transition boundary 1081. Also, the imprint system 100 calculates the center of the circle formed by the transition boundary 1081 to determine a center of the contact surface 112. For example, when the number N of detected transition points 1087 is three or more, the imprint system 100 can use equation (2) to calculate the center of the circle formed by the transition boundary 1081 (which is the center of the contact surface 112) and the radius of the circle formed by the transition boundary 1081 (which is also the perimeter of the contact surface 112), for example by solving the three unknowns $x_c$, $y_c$ and R using equation (1) (e.g., by using multiple instances of equation (1)—one for each of the N transition points):

$$(x_i - x_c)^2 + (y_i - y_c)^2 = R^2 \qquad (2)$$

where $x_i$, $y_i$ is a transition point; where i=1, 2, . . . N; and where N>=3. And the imprint system 100 can further calculate the coordinates of more of the points on the transition boundary 1081.

Then, in block B920, the imprint system 100 registers (e.g., aligns) the superstrate 108 to a substrate chuck 104 (or to a substrate 102) based on the one or more transition points 1087. For example, the imprint system 100 may align the center of the contact surface 112 to the center of the substrate chuck 104 (or the center of the substrate 102), or the imprint system 100 may align an edge 1083 of the superstrate 108 to an edge of the substrate 102 based on the one or more transition points 1087, on the dimensions of the tapered region 1082, and on the dimensions of the substrate 102.

Also, in some embodiments, the imprint system 100 performs an imprinting process on the substrate 102 using the superstrate 108.

Finally, the flow ends in block B925.

FIG. 11 illustrates an example embodiment of an operational flow for registering a superstrate to a substrate chuck (or to a substrate). In FIG. 11, the flow starts in block B1100 and then moves to block B1105, where an imprint system 100 applies a negative atmospheric pressure to a back surface 1086 of a superstrate 108 that is held by a superstrate chuck assembly 118. The negative atmospheric pressure may cause the superstrate 108 to bend or bow upwards with a desired curvature. For example, the negative atmospheric pressure may be applied such that a transition boundary 1081 on a front surface 1085 of the superstrate 108 is lower than any other part of the superstrate 108 and such that the back surface 1086 of the superstrate 108 forms a convex surface and at least part of the front surface 1085 (e.g., a contact surface 112) of the superstrate 108 forms a concave surface.

Next, in block B1110, the imprint system 100 scans the front surface 1085 of the superstrate 108 along three or more scanning paths 1088 to generate three or more surface profiles of the front surface 1085. For example, the imprint system 100 may move the superstrate 108 and one or more sensors 141 relative to each other such that the one or more sensors 141 scan the front surface 1085 along the three or more scanning paths 1088.

The flow then proceeds to block B1115, where the imprint system 100 (e.g., a control device 135 of the imprint system 100) detects three or more transition points 1087 on the front surface 1085 of the superstrate 108 based on the three or more surface profiles. For example, the control device 135 may detect a respective transition point 1087 for each surface profile of the three or more surface profiles.

Next, in block B1120, the imprint system 100 calculates the location of a center of a contact surface 112 on the front surface 1085 of the superstrate 108 based on the three or more transition points 1087. To calculate the location of the center of the contact surface 112, the imprint system 100 (e.g., a control device 135 of the imprint system 100) may calculate a shape of a contact surface 112 of the superstrate 108 based on the three or more transition points 1087. Also, in block B1120, the imprint system 100 (e.g., a control device 135 of the imprint system 100) may convert the coordinate systems of the surface profiles to the imprint system's coordinate system.

Then, in block B1125, the imprint system 100 registers (e.g., aligns) the contact surface 112 to a substrate chuck 104 or to a substrate 102 based on the center of the contact surface 112. For example, the imprint system 100 may align the center of the contact surface 112 to a center of the substrate chuck 104 or to a center of the substrate 102.

Also, in some embodiments, the imprint system 100 uses the superstrate 108 while performing an imprinting process on the substrate 102.

Finally, the flow ends in block B1130.

FIG. 12 illustrates an example embodiment of an operational flow for registering a superstrate to a substrate chuck (or to a substrate). In FIG. 12, the flow starts in block B1200 and then moves to block B1205, where an imprint system 100 applies a negative atmospheric pressure to a back surface 1086 of a superstrate 108 that is held by a superstrate chuck assembly 118. The negative atmospheric pressure may cause the superstrate 108 to bend or bow upwards with a desired curvature. For example, the negative atmospheric pressure may be applied such that a transition boundary 1081 on a front surface 1085 of the superstrate 108 is lower than any other part of the superstrate 108 and such that the back surface 1086 of the superstrate 108 forms a convex surface and at least part of the front surface 1085 (e.g., a contact surface 112) of the superstrate 108 forms a concave surface.

Next, in block B1210, the imprint system 100 scans the front surface 1085 of the superstrate 108 along three or more scanning paths 1088 to generate three or more surface profiles of the front surface 1085. For example, the imprint system 100 may move the superstrate 108 and one or more sensors 141 relative to each other such that the one or more sensors 141 scan the front surface 1085 along the three or more scanning paths 1088.

The flow then proceeds to block B1215, where the imprint system 100 (e.g., a control device 135 of the imprint system 100) detects three or more transition points 1087 on the front surface 1085 of the superstrate 108 based on the three or more surface profiles. For example, the control device 135 may detect a respective transition point 1087 for each surface profile of the three or more surface profiles.

Next, in block B1220, the imprint system 100 (e.g., a control device 135 of the imprint system 100) detects (e.g., calculates) the location of a center of a contact surface 112 on the front surface 1085 of the superstrate 108 based on the three or more transition points 1087. To detect the location of the center of the contact surface 112, the imprint system 100 may calculate a shape of a contact surface 112 based on the three or more transition points 1087. Also, block B1220 may include converting the coordinate systems of the surface profiles to the imprint system's coordinate system.

The flow then advances to block B1225, where the imprint system 100 detects (e.g., calculates) a tilt (rotation about the x axis or rotation about the y axis) of the superstrate 108 (particularly a tilt of the contact surface 112) based on the three or more transition points 1087 or on the three or more surface profiles. For example, the calculation of the tilt in some embodiments can be described by equation (3) when the tilt angles are small (e.g., less than 244 milliradians, a typical tilt is less than 1 milliradian):

$$\begin{pmatrix} z_1 \\ z_2 \\ \vdots \\ z_N \end{pmatrix} = \begin{pmatrix} 1 & y_1 & x_1 \\ 1 & y_2 & x_2 \\ \vdots & \vdots & \vdots \\ 1 & y_N & x_N \end{pmatrix} \begin{pmatrix} z \\ \theta_x \\ \theta_y \end{pmatrix}, \quad (3)$$

where $x_i$, $y_i$, $z_i$ is a transition point; where i=1, 2, . . . N; where the number of transition points N>=3; where $\theta_x$ is the rotation about the x axis; and where $\theta_y$ is the rotation about the y axis. When N is greater than 3, then least square minimization may be used to find z, $\theta_x$, and $\theta_y$.

Then, in block B1230, the imprint system 100 registers the contact surface 112 to a substrate chuck 104 (or to a substrate 102). For example, the imprint system 100 may align the center of the contact surface 112 to a center of the substrate chuck 104.

The flow then moves to block B1235, where the imprint system 100 adjusts the tilt of the superstrate 108 based on the tilt that was detected in block B1225. For example, the imprint system 100 may use the tilt that was calculated in block B1225 to calculate adjustments that can be made to the superstrate 108 to eliminate or minimize the tilt of the contact surface 112 (such that the contact surface 112 lies on the x-y plane) and then make the calculated adjustments to the superstrate 108.

Also, in some embodiments, the imprint system 100 uses the substrate 108 to perform an imprinting process on the substrate 102.

Finally, the flow ends in block B1240.

Figure 13:
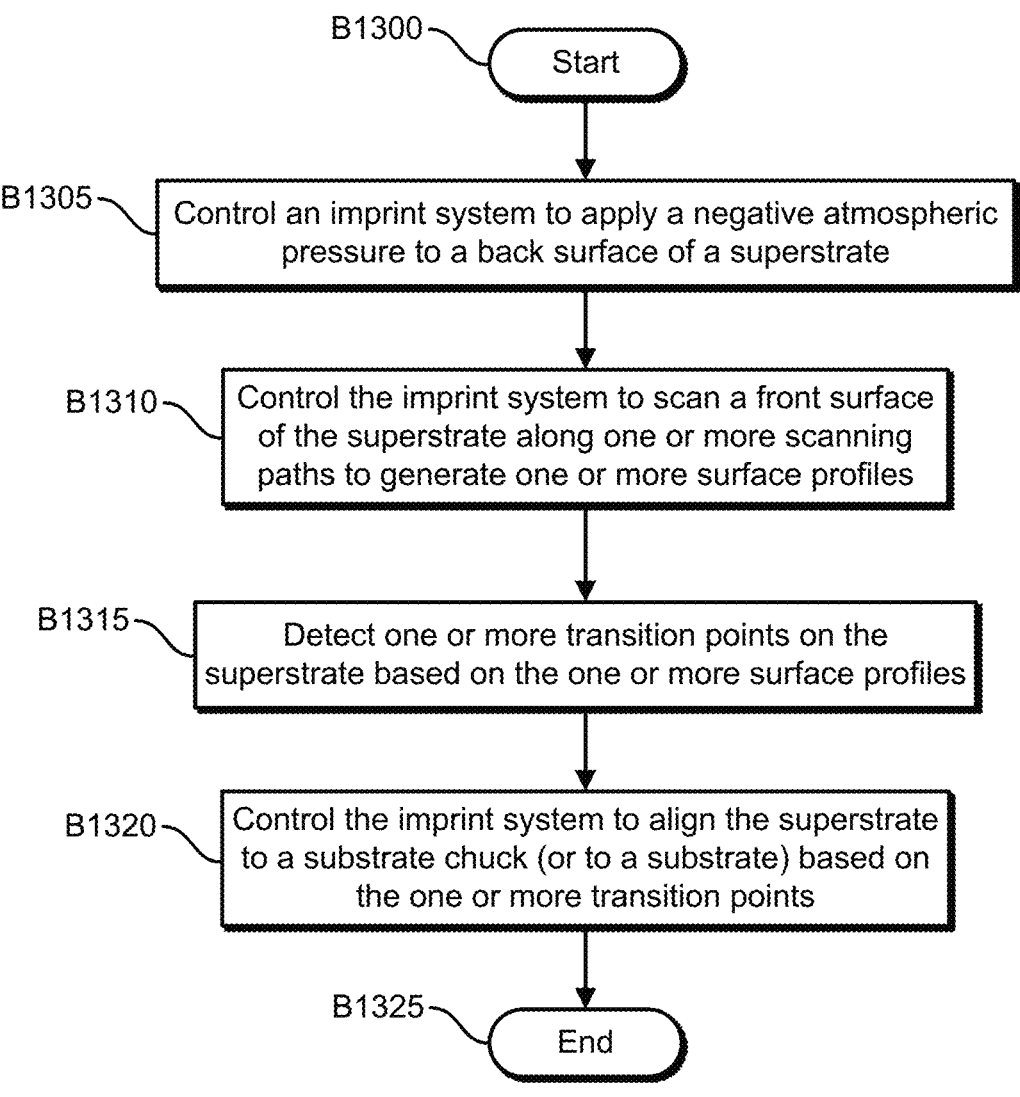
FIG. 13 illustrates an example embodiment of an operational flow for registering a superstrate to a substrate chuck (or to a substrate).

FIG. 13 illustrates an example embodiment of an operational flow for registering a superstrate to a substrate chuck (or to a substrate). Furthermore, although this operational flow is performed by a control device 135 of an imprint system 100, some embodiments of these operational flows are performed by two or more control devices or by one or more other specially-configured computing devices.

In FIG. 13, the flow starts in block B1300 and then moves to block B1305, where a control device controls an imprint system 100 to apply a negative atmospheric pressure to a back surface 1086 of a superstrate 108 that is held by a superstrate chuck assembly 118. The negative atmospheric pressure may cause the superstrate 108 to bend or bow upwards with a desired curvature. For example, the negative atmospheric pressure may be applied such that a transition boundary 1081 on a front surface 1085 of the superstrate 108 is lower than any other part of the superstrate 108 and such that the back surface 1086 of the superstrate 108 forms a convex surface and at least part of the front surface 1085 (e.g., a contact surface 112) of the superstrate 108 forms a concave surface.

Next, in block B1310, control device 135 then controls the imprint system 100 to scan the front surface 1085 of the superstrate 108 along one or more scanning paths 1088 to generate one or more surface profiles of the front surface 1085. For example, the control device 135 may control the imprint system 100 to move the superstrate 108 and one or more sensors 141 relative to each other such that the one or more sensors 141 scan the front surface 1085 along the one or more scanning paths 1088.

The flow then proceeds to block B1315, where the control device 135 detects one or more transition points 1087 on the front surface 1085 of the superstrate 108 based on the one or more surface profiles. For example, the control device 135 may detect a respective transition point 1087 in each surface profile of the one or more surface profiles.

Then, in block B1320, control device 135 controls the imprint system 100 to register the superstrate 108 to a substrate chuck 104 (or to a substrate 102) based on the one or more transition points 1087. For example, the control device 135 may control the imprint system 100 to align the center of the contact surface 112 to the center of the substrate chuck 104 (or the center of the substrate 102), or the control device 135 may control the imprint system 100 to align an edge 1083 of the superstrate 108 to an edge of the substrate 102 based on the one or more transition points 1087, on the dimensions of the tapered region 1082, and on the dimensions of the substrate 102.

Also, in some embodiments, the control device 135 controls the imprint system 100 to perform an imprinting process on the substrate 102 using the superstrate 108.

Finally, the flow ends in block B1325.

Figure 14:
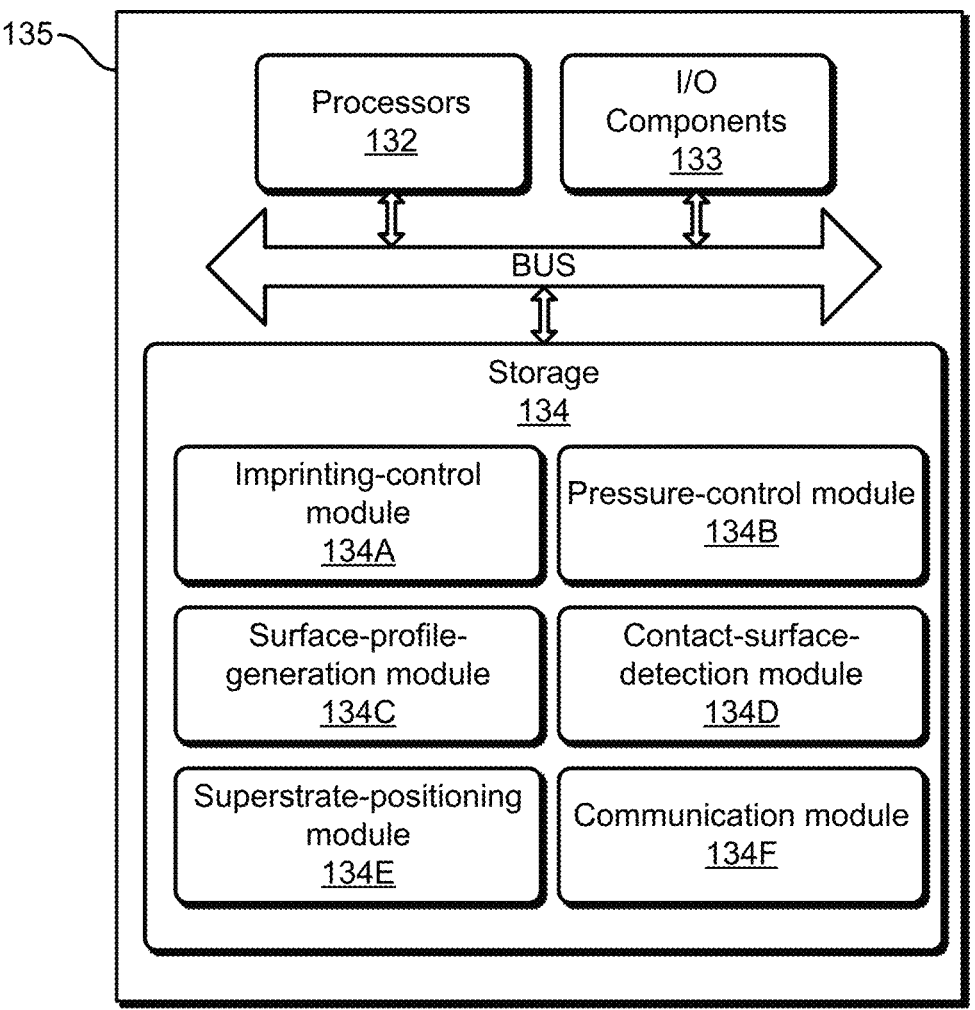
FIG. 14 illustrates an example embodiment of a control device.

FIG. 14 illustrates an example embodiment of a control device. The control device 135 includes one or more processors 132, one or more I/O components 133, and storage 134. Also, the hardware components of the control device 135 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 132 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 133 may include communication components that communicate with one or more of the following: a substrate positioning stage, an imprint head, a fluid dispenser, an energy source, and a camera. Also, the I/O components 133 may include communication components (e.g., a graphics card, a network-interface controller) that communicate with a network, another control device, or with input or output devices (not illustrated), for example a display device, a keyboard, a mouse, a printing device, a touch screen, a light pen, an optical-storage device, a scanner, a microphone, a drive, a joystick, and a control pad.

The storage 134 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 134, which may include both ROM and RAM, can store computer-readable data or computer-executable instructions.

The control device 135 also includes an imprinting-control module 134A, a pressure-control module 134B, a surface-profile-generation module 134C, a contact-surface-detection module 134D, a superstrate-positioning module 134E, and a communication module 134F. A module includes logic, computer-readable data, or computer-executable instructions. In the embodiment shown in FIG. 14, the modules are implemented in software (e.g., Assembly, C, C++, C#, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 134. Also, some embodiments of the control device 135 include additional modules, omit some of these modules, combine these modules into fewer modules, or divide these modules into more modules.

The imprinting-control module 134A includes instructions that cause the applicable components (e.g., the processors 132, the I/O components 133, the storage 134) of the control device 135 to control various functions and components (e.g., a substrate positioning stage 107, an imprint head 119, a fluid dispenser 122, an energy source 126, an imaging device 136, a substrate-heating system 166) of an imprint system 100 (or imprint device) to perform imprinting processes (e.g., IAP processes) on substrates 102 (e.g., on the imprint fields of substrates 102). Also, the applicable components of the control device 135 operating according to the imprinting-control module 134A realize an example of an imprinting-control unit.

The pressure-control module 134B includes instructions that cause the applicable components (e.g., the processors 132, the I/O components 133, the storage 134) of the control device 135 to control the applicable components (e.g., vacuum sources, valves) of an imprint system (or imprint device) to vary the atmospheric pressure above a superstrate 108. For example, some embodiments of the pressure-control module 134B include instructions that cause the applicable components of the control device 135 to perform, or to control an imprint system 100 (or imprint device) to perform, at least some of the operations that are described in block B905 in FIG. 9, in block B1105 in FIG. 11, in block B1205 in FIG. 12, and in block B1305 in FIG. 13. Also, the applicable components of the control device 135 operating according to the pressure-control module 134B realize an example of a pressure-control unit.

The surface-profile-generation module 134C includes instructions that cause the applicable components (e.g., the processors 132, the I/O components 133, the storage 134) of the control device 135 to control the applicable components (e.g., at least one sensor 141, a substrate positioning stage 107, an imprint head 119) of an imprint system 100 (or imprint device) to generate one or more surface profiles of respective superstrates 108 by scanning the front surfaces 1085 of the superstrates 108. For example, some embodiments of the surface-profile-generation module 134C include instructions that cause the applicable components of the control device 135 to perform, or to control an imprint system 100 (or imprint device) to perform, at least some of the operations that are described in block B910 in FIG. 9, in block B1110 in FIG. 11, in block B1210 in FIG. 12, and in block B1310 in FIG. 13. Also, the applicable components of the control device 135 operating according to the surface-profile-generation module 134C realize an example of a surface-profile-generation unit.

The contact-surface-detection module 134D includes instructions that cause the applicable components (e.g., the processors 132, the I/O components 133, the storage 134) of the control device 135 to detect transition points 1087 in respective surface profiles, to detect a center of a contact surface 112 based on detected transition points 1087, to detect a shape of a contact surface 112 based on detected transition points 1087, or to detect a tilt of a superstrate 108 (particularly a contact surface 112) based on detected transition points 1087. For example, some embodiments of the contact-surface-detection module 134D include instructions that cause the applicable components of the control device 135 to perform at least some of the operations that are described in block B915 in FIG. 9, in blocks B1115 and B1120 in FIG. 11, in blocks B1215-B1225 in FIG. 12, and in block B1315 in FIG. 13. Also, the applicable components of the control device 135 operating according to the contact-surface-detection module 134D realize an example of a contact-surface-detection unit.

The superstrate-positioning module 134E includes instructions that cause the applicable components (e.g., the processors 132, the I/O components 133, the storage 134) of the control device 135 to control the applicable components (e.g., a substrate positioning stage 107, an imprint head 119) of an imprint system 100 (or imprint device) to position (e.g., register) a superstrate 108 relative to a substrate chuck 104 (or to a substrate 102) or to adjust a tilt of the superstrate 108. For example, some embodiments of the superstrate-positioning module 134E include instructions that cause the applicable components of the control device 135 to perform, or to control an imprint system 100 (or imprint device) to perform, at least some of the operations that are described in block B920 in FIG. 9, in block B1125 in FIG. 11, in blocks B1230-B1235 in FIG. 12, and in block B1320 in FIG. 13. Also, the applicable components of the control device 135 operating according to the superstrate-positioning module 134E realize an example of a superstrate-positioning unit.

The communication module 134E includes instructions that cause the applicable components (e.g., the processors 132, the I/O components 133, the storage 134) of the control device 135 to communicate with one or more other devices (e.g., a display device, another computing device). Also, the applicable components of the control device 135 operating according to the communication module 134E realize an example of a communication unit.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method of measuring a tapered edge on a plate, the method comprising:

holding a periphery of a back surface of a plate with a ring portion of a chuck assembly;

applying a negative vacuum pressure to a central portion of the back surface of the plate to bow the central portion of the plate such that the back surface of the plate forms a convex surface and a front surface of the plate forms a concave surface;

measuring, at or near the periphery of the plate, a height of the plate; and identifying a location of a transition point of a tapered edge of the plate based on the height of the plate, wherein the front surface of the plate includes a contact surface that is surrounded by the tapered edge, wherein a thickness of the plate at an outer edge of the plate is less than a thickness of the plate throughout the contact surface of the plate, wherein the outer edge of the plate is an outer perimeter of the tapered edge, wherein an outer edge of the contact surface is an inner perimeter of the tapered edge, wherein the transition point is located on the inner perimeter of the tapered edge, and wherein the negative vacuum pressure bows the central portion of the plate towards the negative vacuum pressure such that the contact surface forms the concave surface and such that an outer edge of the concave surface is defined by the inner perimeter of the tapered edge.

2. The method of claim 1, wherein identifying the location of the transition point of the tapered edge of the plate based on the height of the plate includes:

identifying respective locations of at least three transition points of the tapered edge of the plate based on the height of the plate.

3. The method of claim 2, further comprising:

identifying a center of the plate based on the at least three transition points of the tapered edge of the plate.

4. The method of claim 3, further comprising:

identifying the inner perimeter of the tapered edge based on the at least three transition points of the tapered edge of the plate.

5. The method of claim 1, wherein measuring the height of the plate at or near the periphery of the plate includes:

measuring a distance at each of a plurality of measuring points, wherein each measuring point of the plurality of measuring points is located at or near the periphery of the plate, and wherein the plurality of measuring points are located on a path that extends in a radial direction from the central portion of the plate to the outer edge of the plate.

6. An imprint system comprising:

a sensor;

a vacuum pump;

a superstrate chuck including a ring portion, wherein the ring portion is configured to hold a periphery of a back surface of a plate;

one or more memories; and one or more processors, wherein the one or more processors and the one or more memories cooperate to cause the imprint system to perform operations that comprise:

controlling the vacuum pump to generate an atmospheric pressure at a central portion of the back surface of the plate that is lower than an atmospheric pressure at the central portion of a front surface of the plate such that the back surface of the plate forms a convex surface and the front surface of the plate forms a concave surface;

controlling the sensor to measure, at each measuring point of a plurality of measuring points at or near the periphery of the front surface the plate, a height of the measuring point; and identifying a respective location of each transition point of one or more transition points of a tapered edge of the plate based on the respective height of each measuring point of the plurality of measuring points, wherein the front surface of the plate includes a contact surface that is surrounded by the tapered edge, wherein a thickness of the plate at an outer edge of the plate is less than a thickness of the plate throughout the contact surface of the plate, wherein the outer edge of the plate is an outer perimeter of the tapered edge, wherein an outer edge of the contact surface is an inner perimeter of the tapered edge, wherein each transition point of the one or more transition points is located on the inner perimeter of the tapered edge, and wherein the negative vacuum pressure bows the central portion of the plate towards the negative vacuum pressure such that the contact surface forms the concave surface and such that an outer edge of the concave surface is defined by the inner perimeter of the tapered edge.

7. The imprint system of claim 6, wherein some of the plurality of measuring points are located on the tapered edge, and wherein some of the plurality of measuring points are located on the contact surface.

8. The imprint system of claim 6, wherein the one or more transition points of the tapered edge include at least three transition points of the tapered edge, and wherein the one or more processors and the one or more memories further cooperate to cause the imprint system to:

identify a center of the plate based on the at least three transition points of the tapered edge.

9. The imprint system of claim 8, wherein the one or more processors and the one or more memories further cooperate to cause the imprint system to:

identify the inner perimeter of the tapered edge based on the at least three transition points of the tapered edge.

10. The imprint system of claim 6, further comprising:

one or more actuators or motors that are configured to move the sensor relative to the plate, wherein, to control the sensor to measure, at each measuring point of the plurality of measuring points, the respective height, the one or more processors and the one or more memories further cooperate to cause the imprint system to:

control the one or more actuators or motors to repeatedly move the sensor relative to the plate such that the sensor is positioned to measure the respective height of each of the measuring points.

11. A method comprising:

holding a periphery of a back surface of a plate with a ring portion of a chuck, wherein the plate includes a front surface, wherein the front surface includes a contact surface that is surrounded by a sloping edge, and wherein, between the contact surface and an outer edge of the plate, the sloping edge slopes away from the contact surface toward the back surface;

reducing an atmospheric pressure at a central portion of the back surface of the plate such that the back surface of the plate forms a convex surface and the front surface of the plate forms a concave surface;

measuring, for each point of a plurality of points on the front surface of the plate that are at or near a periphery of the front surface of the plate, a respective height between the point and a plane of the chuck; and identifying at least one transition point between the sloping edge and the contact surface based on the respective heights, wherein a thickness of the plate at the outer edge of the plate is less than a thickness of the plate throughout the contact surface of the plate, wherein the outer edge of the plate is an outer perimeter of the sloping edge, wherein an outer edge of the contact surface is an inner perimeter of the sloping edge, wherein the at least one transition point is located on the inner perimeter of the sloping edge, and wherein the negative vacuum pressure bows the central portion of the plate towards the negative vacuum pressure such that the contact surface forms the concave surface and such that an outer edge of the concave surface is defined by the inner perimeter of the sloping edge.

12. The method of claim 11, wherein the at least one transition point includes three or more transition points.

13. The method of claim 12, further comprising:

identifying a center of the front surface of the plate based on the three or more transition points.

14. The method of claim 12, further comprising:

identifying a boundary between the sloping edge and the contact surface based on the three or more transition points.

15. The method of claim 12, further comprising:

calculating a tilt of the contact surface based on the three or more transition points.

16. The method of claim 11, wherein identifying the at least one transition point between the sloping edge and the contact surface based on the respective heights includes:

generating a surface profile of the front surface based on the respective heights; and calculating a derivative of the surface profile.

17. The method of claim 11, further comprising:

positioning the plate based on the at least one transition point; and bringing the plate into contact with formable material that has been deposited on a superstrate.

\* \* \* \* \*